US011843382B2

(12) United States Patent
Ding et al.

(10) Patent No.: US 11,843,382 B2
(45) Date of Patent: Dec. 12, 2023

(54) LEVEL SHIFTER CIRCUIT AND METHOD OF OPERATING THE SAME

(71) Applicants: TAIWAN SEMICONDUCTOR MANUFACTURING COMPANY, LTD., Hsinchu (TW); TSMC CHINA COMPANY, LIMITED, Shanghai (CN); TSMC NANJING COMPANY, LIMITED, Nanjing (CN)

(72) Inventors: Jing Ding, Hsinchu (TW); Zhang-Ying Yan, Hsinchu (TW); Qingchao Meng, Hsinchu (TW); Lei Pan, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN); TSMC CHINA COMPANY, LIMITED, Shanghai (CN)

(*) Notice: Subject to any disclaimer, the term of this patent is extended or adjusted under 35 U.S.C. 154(b) by 0 days.

(21) Appl. No.: 17/736,913

(22) Filed: May 4, 2022

(65) Prior Publication Data
US 2023/0291394 A1    Sep. 14, 2023

(30) Foreign Application Priority Data
Mar. 14, 2022 (CN) .......................... 202210246446.7

(51) Int. Cl.
*H03K 3/037* (2006.01)
*G06F 30/392* (2020.01)
*H03K 19/0185* (2006.01)

(52) U.S. Cl.
CPC ........... *H03K 3/037* (2013.01); *G06F 30/392* (2020.01); *H03K 19/018521* (2013.01)

(58) Field of Classification Search
CPC .. H03K 3/037; H03K 19/018521; H03K 3/03; H03K 3/356182; H03K 3/356113;
(Continued)

(56) References Cited

U.S. PATENT DOCUMENTS 7,260,442 B2    8/2007 Hwang et al.
9,256,709 B2    2/2016 Yu et al.
(Continued)

FOREIGN PATENT DOCUMENTS

TW          200644425       12/2006

*Primary Examiner* — John W Poos
*Assistant Examiner* — Tyler J Pereny
(74) *Attorney, Agent, or Firm* — Hauptman Ham, LLP

(57) ABSTRACT

A circuit includes an input circuit, a level shifter circuit and an output circuit. The input circuit is coupled to a first voltage supply, and configured to receive a first input signal, and to generate at least a second or a third input signal. The level shifter circuit is coupled to the input circuit and a second voltage supply, and configured to receive a first enable signal, the second or third input signal, and to generate a first signal responsive to the first enable signal, the second input signal or the third input signal. The level shifter circuit includes a header circuit coupled to a first node, and is configured to enable or disable the level shifter circuit responsive to the first enable signal. The output circuit is coupled to at least the level shifter circuit and the second voltage supply, and is configured to generate an output signal.

20 Claims, 13 Drawing Sheets

(58) Field of Classification Search
CPC ....... H03K 19/018528; H03K 19/0016; H03K 19/0013; H03K 19/0185; H03K 19/018557; H03K 3/012; H03K 19/01759; H03K 3/356008; H03K 3/35613; G06F 30/392
See application file for complete search history.

(56) References Cited

U.S. PATENT DOCUMENTS

| | | | |
|---|---|---|---|
| 9,257,973 B1* | 2/2016 | Shay | H03K 19/018528 |
| 9,647,660 B1* | 5/2017 | Alam | H03K 19/018521 |
| 10,110,231 B1* | 10/2018 | Graves | H03K 19/01707 |
| 2014/0040838 A1 | 2/2014 | Liu et al. | |
| 2014/0145777 A1 | 5/2014 | Ma | |
| 2015/0278429 A1 | 10/2015 | Chang | |
| 2019/0131971 A1 | 5/2019 | Lerner et al. | |
| 2022/0182059 A1* | 6/2022 | Yagi | H03K 19/018521 |

* cited by examiner

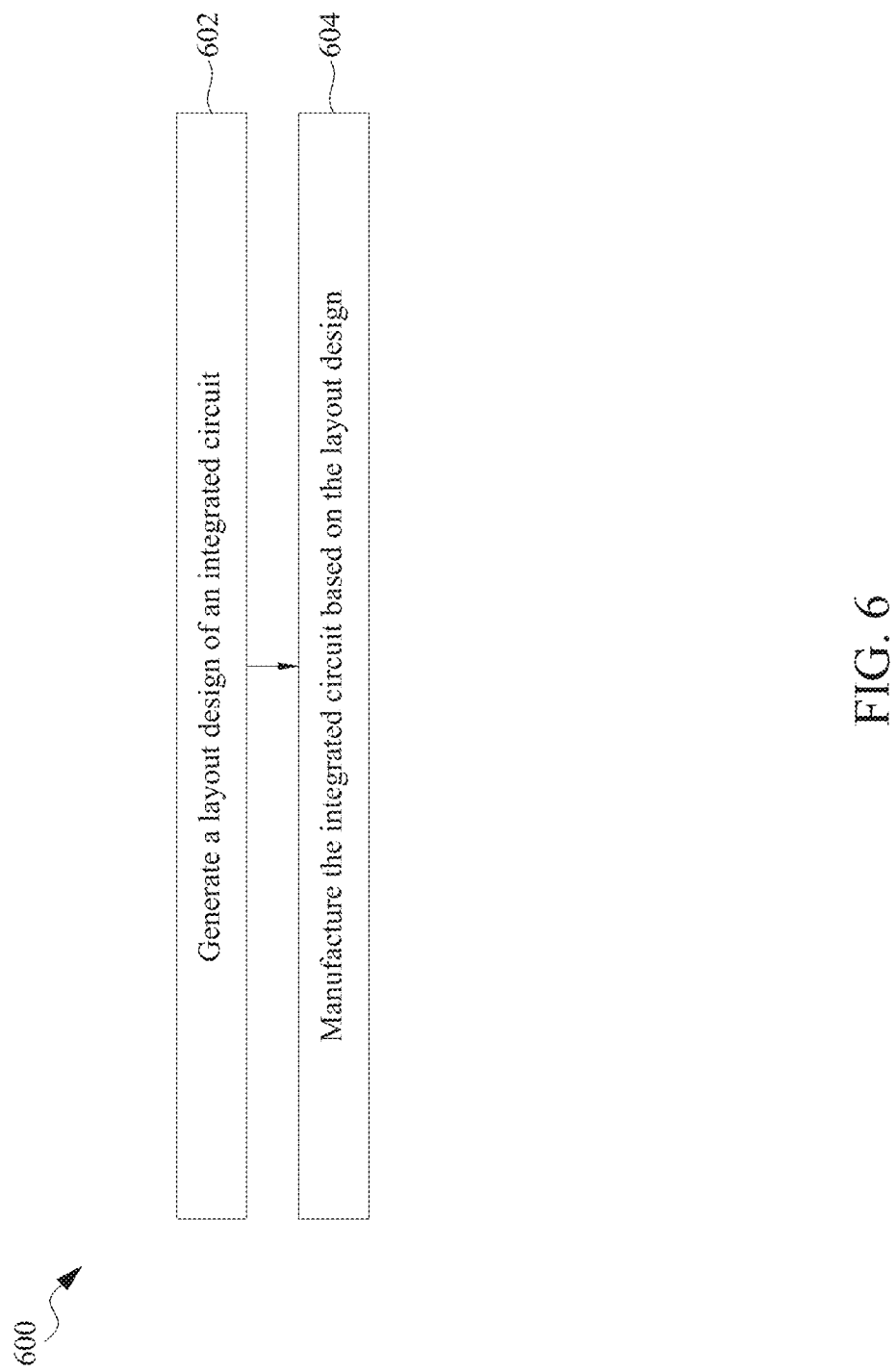

LEVEL SHIFTER CIRCUIT AND METHOD OF OPERATING THE SAME

BACKGROUND

The semiconductor integrated circuit (IC) industry has produced a wide variety of digital devices to address issues in a number of different areas. Some of these digital devices, such as level shifter circuits, are configured to enable operation of circuits capable of operation in different voltage domains. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow chart of a method of forming or manufacturing an integrated circuit, in accordance with some embodiments.

DETAILED DESCRIPTION

Figure 1:
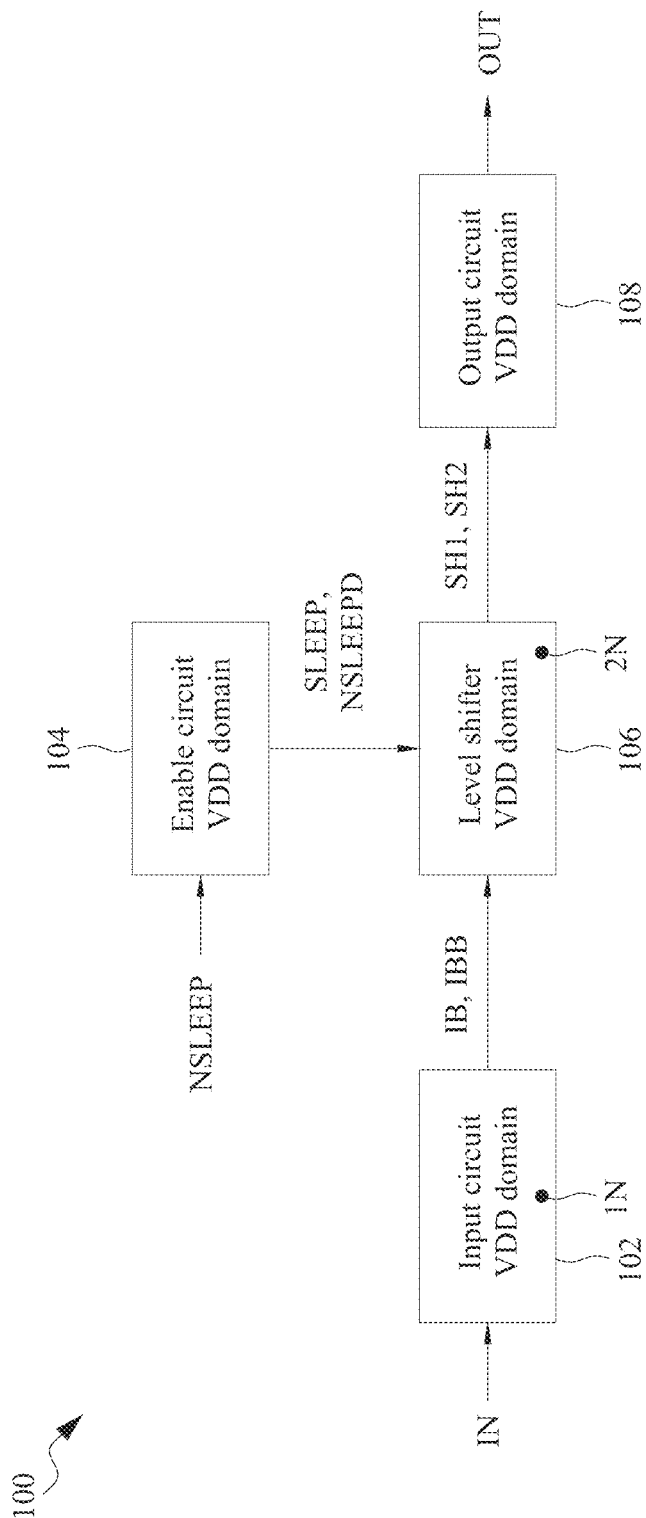
FIG. 1 is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a circuit includes an input circuit, a level shifter circuit and an output circuit. In some embodiments, the input circuit is coupled to a first voltage supply, and is configured to receive a first input signal. In some embodiments, the input circuit is further configured to generate at least a second input signal or a third input signal. In some embodiments, the first input signal has a first voltage swing.

In some embodiments, the level shifter circuit is coupled to at least the input circuit and a second voltage supply different from the first voltage supply.

In some embodiments, the level shifter circuit is configured to receive at least a first enable signal, the second input signal or the third input signal. In some embodiments, the level shifter circuit is configured to generate at least a first signal responsive to at least the first enable signal, the second input signal or the third input signal. In some embodiments, the first signal has a second voltage swing different from the first voltage swing.

In some embodiments, the level shifter circuit includes a header circuit coupled to a first node of the level shifter circuit. In some embodiments, the header circuit is configured to receive the first enable signal. In some embodiments, the header circuit is configured to enable or disable the level shifter circuit responsive to the first enable signal.

In some embodiments, the output circuit is coupled to at least the level shifter circuit and the second voltage supply, and is configured to receive the first signal, and to generate at least an output signal.

In some embodiments, the level shifter circuit further includes a first path and a second path. In some embodiments, the first path and the second path are enabled or disabled by the first enable signal. In some embodiments, the first path or the second path includes the header transistor. In some embodiments, by including the header circuit in the first path or the second path of the level shifter circuit, leakage current in the first path and the second path of the level shifter circuit are reduced or prevented in response to the level shifter circuit being disabled by the first enable signal resulting in lower power consumption than other approaches.

FIG. 1 is a block diagram of an integrated circuit 100, in accordance with some embodiments.

Integrated circuit 100 comprises an input circuit 102, an enable circuit 104, a level shifter circuit 106 and an output circuit 108.

Input circuit 102 is coupled to a first input terminal of level shifter circuit 106. Input circuit 102 is configured to receive an input signal IN, and to generate at least an input signal IB or an input signal IBB. Input signal IB is inverted from input signal IN. Input signal IBB is inverted from input signal IB. In some embodiments, input circuit 102 is configured to output one or more of input signal IN, input signal IB or input signal IBB to level shifter circuit 106.

In some embodiments, input circuit 102 is coupled to a first voltage supply node 1N. In some embodiments, first voltage supply node 1N has a first supply voltage VDDL (FIGS. 2 and 4), and is therefore referred to as being in a VDDL voltage domain. In some embodiments, first supply voltage VDDL has a first voltage swing. In some embodiments, one or more of input signal IN, input signal IB or input signal IBB have the first voltage swing.

Figure 4:
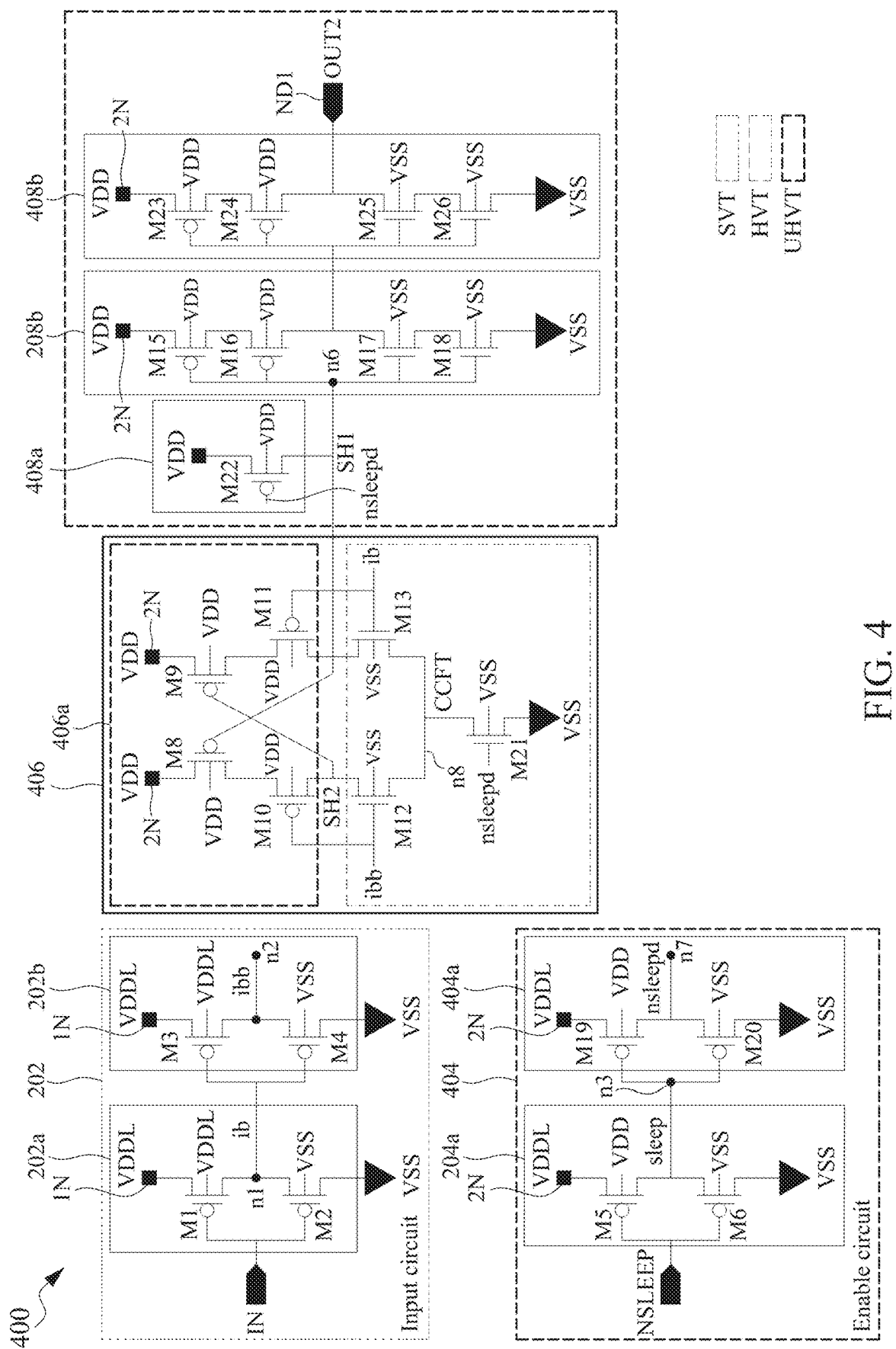
FIG. 4 is a circuit diagram of a circuit, in accordance with some embodiments.

Enable circuit 104 is coupled to a second input terminal of level shifter circuit 106 and a source of signal NSLEEP. Enable circuit 104 is configured to receive a signal NSLEEP, and to generate a signal SLEEP. Signal SLEEP is inverted from signal NSLEEP. In some embodiments, enable circuit 104 is configured to receive signal NSLEEP, and to generate signal SLEEP and a signal NSLEEPD (FIG. 4). Signal NSLEEPD is inverted from signal SLEEP. In some embodiments, enable circuit 104 is configured to output signal SLEEP to level shifter circuit 106. In some embodiments, enable circuit 104 is configured to output at least signal SLEEP or signal NSLEEPD to level shifter circuit 106. In some embodiments, at least signal NSLEEP, signal SLEEP or signal NSLEEPD is a corresponding enable signal configured to enable the level shifter circuit 106 or the output circuit 108.

Level shifter circuit 106 is coupled to input circuit 102, enable circuit 104 and output circuit 108.

Level shifter circuit 106 is configured to receive at least signal SLEEP, input signal IB or input signal IBB. In some embodiments, level shifter circuit 106 is configured to receive at least signal SLEEP, signal NSLEEPD, input signal IB or input signal IBB.

In some embodiments, level shifter circuit 106 is configured to generate at least a first signal SH1 or a second signal SH2 responsive to at least signal SLEEP, signal NSLEEPD, input signal IB or input signal IBB. Level shifter circuit 106 is configured to output at least first signal SH1 or second signal SH2 to output circuit 108. In other words, one or more of first signal SH1 or second signal SH2 is the output of level shifter circuit 106.

In some embodiments, level shifter circuit 106 is coupled to a second voltage supply node 2N having a second supply voltage VDD (FIGS. 2 and 4), and is therefore referred to as being in a VDD voltage domain. In some embodiments, second supply voltage VDD is different from first supply voltage VDDL. In some embodiments, second supply voltage VDD is greater than the first supply voltage VDDL. In some embodiments, second supply voltage VDD is less than the first supply voltage VDDL. In some embodiments, second supply voltage VDD has a second voltage swing different from the first voltage swing. In some embodiments, VDD voltage domain is different from VDDL voltage domain. Level shifter circuit 106 is a level shifter circuit configured to shift input signals IN, INB, or INBB from the VDDL voltage domain that uses a supply voltage VDDL to the VDD voltage domain that uses a supply voltage VDD.

In some embodiments, one or more of first signal SH1 or second signal SH2 are referred to as level shifted output signals. In some embodiments, one or more of first signal SH1 or second signal SH2 has the second voltage swing.

Output circuit 108 is coupled to level shifter circuit 106. An input terminal of output circuit 108 is coupled to at least an output terminal of level shifter circuit 106, and configured to receive at least first signal SH1 or second signal SH2.

Output circuit 108 is configured to generate at least an output signal OUT responsive to at least first signal SH1 or second signal SH2.

An output terminal of output circuit 108 is configured to output the output signal OUT. Output signal OUT is the output signal of integrated circuit 100. In some embodiments, output signal OUT is referred to as a level shifted output signal of integrated circuit 100. In some embodiments, output signal OUT has the second voltage swing. In some embodiments, output signal OUT is a level shifted version of input signal IN.

Integrated circuit 100 is configured to operate in a first mode or a second mode. For example, in the first mode, the level shifter circuit 106 is enabled or awake, and the output signal OUT corresponds to a level shifted version of the input signal IN. In the second mode, the level shifter circuit 106 is disabled or asleep, and the output signal OUT is a logic high or a logic low.

In some embodiments, the first mode is referred to as a level shifting mode, and the second mode is referred to as a sleep mode. In some embodiments, integrated circuit 100 is referred to as a level shifter.

In some embodiments, level shifter circuit 106 is enabled or turned on by signal SLEEP or NSLEEPD having a first logical value. In some embodiments, level shifter circuit 106 is disabled or turned off by signal SLEEP or NSLEEPD having a second logical value. In some embodiments, the second logical value is inverted from the first logical value.

In some embodiments, by disabling the level shifter circuit 106, integrated circuit 100 has better power performance than other approaches. In some embodiments, by disabling the level shifter circuit 106, integrated circuit 100 consumes less power than other approaches.

Figure 2:
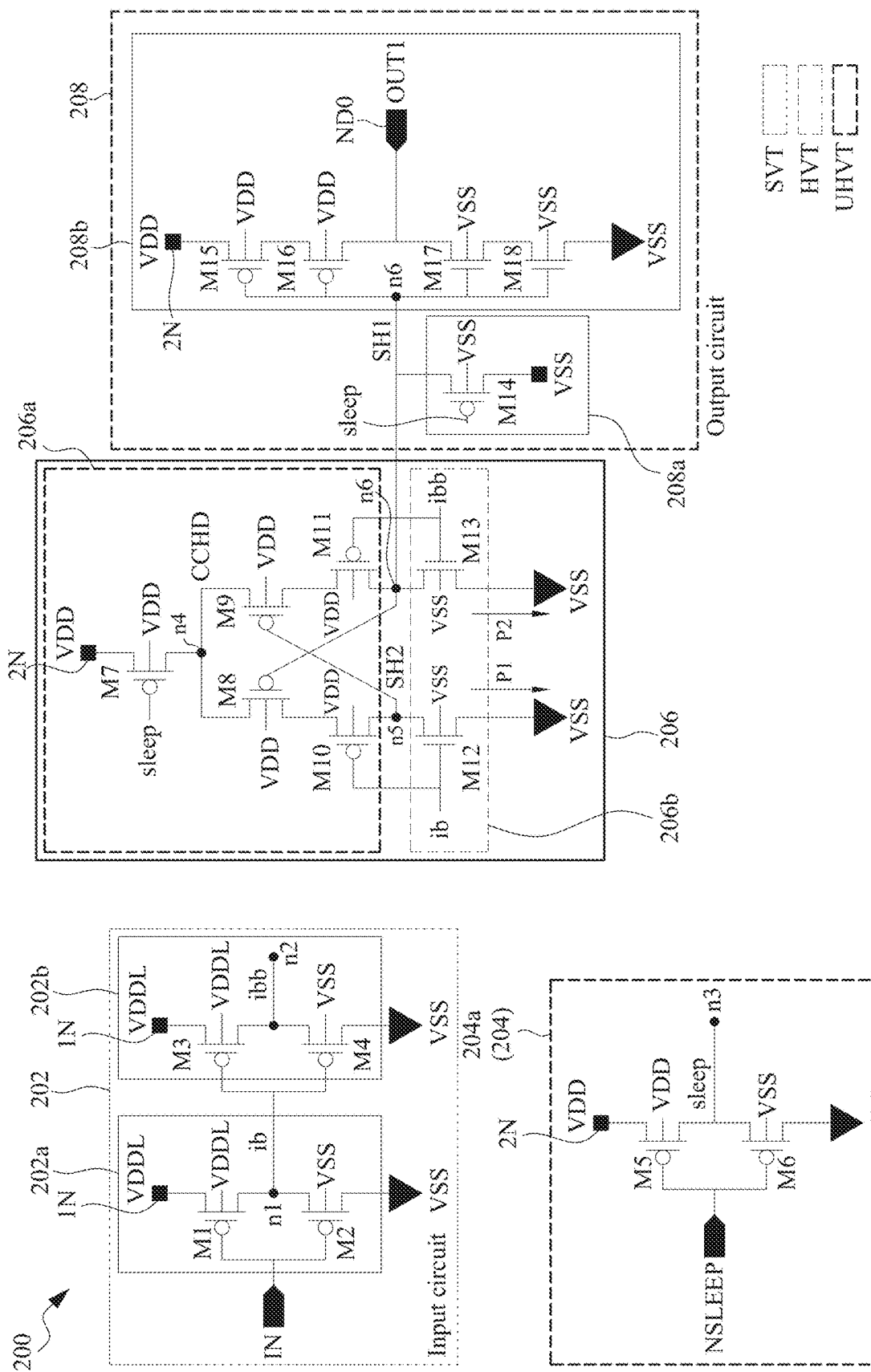
FIG. 2 is a circuit diagram of a circuit, in accordance with some embodiments.

FIG. 2 is a circuit diagram of a circuit 200, in accordance with some embodiments.

Circuit 200 is an embodiment of integrated circuit 100 of FIG. 1.

Circuit 200 comprises an input circuit 202, an enable circuit 204, a level shifter circuit 206 and an output circuit 208.

Input circuit 202 is an embodiment of input circuit 102 of FIG. 1, and similar detailed description is omitted. Input circuit 202 comprises an inverter 202*a* and an inverter 202*b*.

Inverter 202*a* is configured to receive input signal IN, and to output input signal IB. Inverter 202*a* is coupled to the first voltage supply node 1N. Inverter 202*a* and inverter 202*b* are configured to operate in the VDDL voltage domain. Inverter 202*a* is configured to generate input signal IB in response to input signal IN.

Inverter 202*b* is configured to receive input signal IB, and to output input signal IBB. Inverter 202*b* is coupled to the first voltage supply node 1N. Inverter 202*b* is configured to generate input signal IBB in response to input signal IB.

Input circuit 202, inverter 202*a* and inverter 202*b* are coupled to level shifter circuit 206. For ease of illustration, input circuit 202, inverter 202*a* and inverter 202*b* are not shown as being coupled to level shifter circuit 206.

Inverter 202*a* comprises a P-type Metal Oxide Semiconductor (PMOS) transistor M1 and an N-type Metal Oxide Semiconductor (NMOS) transistor M2.

Inverter 202*b* comprises a PMOS transistor M3 and an NMOS transistor M4.

A gate terminal of PMOS transistor M1 and a gate terminal of NMOS transistor M2 are coupled together, and are configured as an input node (not labelled) of input circuit 202. The gate terminal of PMOS transistor M1 and the gate terminal of NMOS transistor M2 are configured to receive input signal IN.

A source terminal of PMOS transistor M1 is coupled to a voltage supply node having the first supply voltage VDDL. A source terminal of NMOS transistor M2 is coupled to a reference voltage supply VSS. A bulk or body terminal of PMOS transistor M1 is coupled to the first voltage supply node 1N having the first supply voltage VDDL. A bulk or body terminal of NMOS transistor M2 is coupled to the reference voltage supply VSS.

A drain terminal of PMOS transistor M1 and a drain terminal of NMOS transistor M2 are coupled together, and are configured as an output node (e.g., node n1) of inverter 202a. The drain terminal of PMOS transistor M1 and the drain terminal of NMOS transistor M2 are configured to output the input signal IB on node n1.

Each of the drain terminal of PMOS transistor M1, the drain terminal of NMOS transistor M2, a gate terminal of PMOS transistor M3 and a gate terminal of NMOS transistor M4 are coupled together at node n1.

The gate terminal of PMOS transistor M3 and the gate terminal of NMOS transistor M4 are configured to receive input signal IB from the drain terminal of PMOS transistor M1 and the drain terminal of NMOS transistor M2.

A drain terminal of PMOS transistor M3 and a drain terminal of NMOS transistor M4 are coupled together, and are configured as an output node (e.g., node n2) of inverter 202b. The drain terminal of PMOS transistor M3 and the drain terminal of NMOS transistor M4 are configured to output the input signal IBB on node n2.

A source terminal of PMOS transistor M3 is coupled to the first voltage supply node 1N having the first supply voltage VDDL. A source terminal of NMOS transistor M4 is coupled to a reference voltage supply VSS. A bulk or body terminal of PMOS transistor M3 is coupled to the first voltage supply node 1N having the first supply voltage VDDL. A bulk or body terminal of NMOS transistor M4 is coupled to the reference voltage supply VSS.

Other transistor types or number of transistors in input circuit 202 are within the scope of the present disclosure.

Enable circuit 204 is an embodiment of enable circuit 104 of FIG. 1, and similar detailed description is omitted. Enable circuit 204 comprises an inverter 204a coupled to the second voltage supply node 2N. Enable circuit 204 is coupled to at least level shifter circuit 206 or output circuit 208. For ease of illustration, enable circuit 204 is not shown as being coupled to level shifter circuit 206 or output circuit 208.

Inverter 204a is configured to receive signal NSLEEP, and to output signal SLEEP. Inverter 204a is coupled to the second voltage supply node 2N. Inverter 204a is configured to operate in the VDD voltage domain. Inverter 204a is configured to generate signal SLEEP in response to signal NSLEEP. An input terminal of inverter 204a is configured to receive signal NSLEEP. An output terminal of inverter 204a is configured to output signal SLEEP to level shifter circuit 206 and output circuit 208 on node n3. An output terminal of inverter 204a is coupled to level shifter circuit 206 and output circuit 208 at node n3.

Inverter 204a comprises a PMOS transistor M5 and an NMOS transistor M6.

A gate terminal of PMOS transistor M5 and a gate terminal of NMOS transistor M6 are coupled together, and are configured as an input node (not labelled) of enable circuit 204. The gate terminal of PMOS transistor M5 and the gate terminal of NMOS transistor M6 are configured to receive signal NSLEEP.

A source terminal of PMOS transistor M5 is coupled to the second voltage supply node 2N having the second supply voltage VDD. A source terminal of NMOS transistor M6 is coupled to a reference voltage supply VSS. A bulk or body terminal of PMOS transistor M5 is coupled to the second voltage supply node 2N having the second supply voltage VDD. A bulk or body terminal of NMOS transistor M6 is coupled to the reference voltage supply VSS.

A drain terminal of PMOS transistor M5 and a drain terminal of NMOS transistor M6 are coupled together, and are configured as an output node (e.g., node n3) of inverter 204a. The drain terminal of PMOS transistor M5 and the drain terminal of NMOS transistor M6 are configured to output the signal SLEEP on node n3.

Other transistor types or number of transistors in enable circuit 204 are within the scope of the present disclosure.

Level shifter circuit 206 is an embodiment of level shifter circuit 106 of FIG. 1, and similar detailed description is omitted. Level shifter circuit 206 is configured to shift input signals IN, IB or IBB from the VDDL voltage domain to the VDD voltage domain. Level shifter circuit 206 is coupled to at least input circuit 202, enable circuit 204 and output circuit 208. Level shifter 206 is configured to receive at least signal NSLEEP, input signal IB or input signal IBB. Level shifter 206 is configured to generate first signal SH1 responsive to at least signal NSLEEP or input signal IBB. Level shifter 206 is configured to generate second signal SH2 responsive to at least signal NSLEEP or input signal IB. First signal SH1 or second signal SH2 is the output of level shifter circuit 206. Level shifter circuit 206 is configured to operate in the VDD voltage domain. In some embodiments, one or more of first signal SH1 or second signal SH2 is the level shifted output signal (e.g., second voltage swing) of input signal IN (e.g., first voltage swing).

Level shifter circuit 206 comprises PMOS transistors M7, M8, M9, M10 and M11 and NMOS transistors M12 and M13. Each of PMOS transistors M7, M8, M9, M10 and M11 and NMOS transistors M12 and M13 is configured to operate in the VDD voltage domain.

PMOS transistors M7, M8, M9, M10 and M11 are part of a region 206a of the level shifter circuit 206. NMOS transistors M12 and M13 are part of a region 206b of the level shifter circuit 206.

PMOS transistor M7 is coupled between a node n4 of level shifter circuit 206 and the second voltage supply node 2N. A voltage of the node n4 corresponds to a voltage of signal CCHD. PMOS transistor M7 is also referred to as a header circuit.

A source terminal of PMOS transistor M7 is coupled with the second voltage supply node 2N having the second supply voltage VDD. A drain terminal of PMOS transistor M7 is coupled with node n4, a source terminal of PMOS transistor M8 and a source terminal of PMOS transistor M9. A bulk or body terminal of PMOS transistor M7 is coupled to the second voltage supply node 2N.

A gate terminal of PMOS transistor M7 is coupled to at least the drain terminal of PMOS transistor M5 and the drain terminal of NMOS transistor M6 at node n3. A gate terminal of PMOS transistor M7 is configured to receive the signal SLEEP. PMOS transistor M7 is turned on or off based on signal SLEEP. In response to being turned on by signal SLEEP, PMOS transistor M7 electrically couples node n4 to the second voltage supply node 2N, thereby setting the voltage of node n4 to be equal to the second supply voltage VDD. In response to being turned off by signal SLEEP, PMOS transistor M7 electrically decouples node n4 and the second voltage supply node 2N from each other.

PMOS transistors M8 and M10 (collectively referred to as "a first set of transistors") are coupled between a first node n5 of level shifter circuit 206 and node n4. A voltage of the first node n5 corresponds to a voltage of second signal SH2.

PMOS transistors M9 and M11 (collectively referred to as "a second set of transistors") are coupled between a second node n6 of level shifter circuit 206 and node n4. A voltage of the second node n6 corresponds to a voltage of first signal SH1.

Each of node n6, a gate terminal of PMOS transistor M8, a drain terminal of PMOS transistor M11, a drain terminal of NMOS transistor M13, a drain terminal of NMOS transistor M14, a gate terminal of PMOS transistor M15, a gate terminal of PMOS transistor M16, a gate terminal of NMOS transistor M17 and a gate terminal of NMOS transistor M18 are coupled together.

The gate terminal of PMOS transistor M8 is configured to receive the first signal SH1. PMOS transistor M9 is turned on or off based on first signal SH1.

Each of a source terminal of PMOS transistor M8, a source terminal of PMOS transistor M9 and the drain terminal of PMOS transistor M7 are coupled together at node n4.

A drain terminal of PMOS transistor M8 and a source terminal of PMOS transistor M10 are coupled together. A bulk or body terminal of PMOS transistor M8 is coupled to the second voltage supply node 2N.

Each of node n5, a gate terminal of PMOS transistor M9, a drain terminal of PMOS transistor M10 and a drain terminal of NMOS transistor M12 are coupled together.

The gate terminal of PMOS transistor M9 is configured to receive the second signal SH2. PMOS transistor M9 is turned on or off based on second signal SH2.

A drain terminal of PMOS transistor M9 and a source terminal of PMOS transistor M11 are coupled together. A bulk or body terminal of PMOS transistor M9 is coupled to the second voltage supply node 2N.

A gate terminal of PMOS transistor M10 is configured to receive the input signal IB. PMOS transistor M10 is turned on or off based on input signal IB.

Each of the gate terminal of PMOS transistor M10, a gate terminal of NMOS transistor M12, the drain terminal of PMOS transistor M1, the drain terminal of NMOS transistor M2 and node n1 are coupled together. A bulk or body terminal of PMOS transistor M10 is coupled to the second voltage supply node 2N.

A gate terminal of PMOS transistor M11 is configured to receive the input signal IBB. PMOS transistor M11 is turned on or off based on input signal IBB.

Each of the gate terminal of PMOS transistor M11, a gate terminal of NMOS transistor M13, the drain terminal of PMOS transistor M3, the drain terminal of NMOS transistor M4 and node n2 are coupled together. A bulk or body terminal of PMOS transistor M11 is coupled to the second voltage supply node 2N.

A gate terminal of NMOS transistor M12 is configured to receive the input signal IB. NMOS transistor M12 is turned on or off based on input signal IB. A source terminal of NMOS transistor M12 is coupled to the reference voltage supply VSS. A bulk or body terminal of NMOS transistor M12 is coupled to the reference voltage supply VSS.

A gate terminal of NMOS transistor M13 is configured to receive the input signal IBB. NMOS transistor M13 is turned on or off based on input signal IBB. A source terminal of NMOS transistor M13 is coupled to the reference voltage supply VSS. A bulk or body terminal of NMOS transistor M13 is coupled to the reference voltage supply VSS.

NMOS transistor M12, PMOS transistor M8 and PMOS transistor M10 are referred to as a first path P1 of level shifter circuit 206. NMOS transistor M13, PMOS transistor M9 and PMOS transistor M11 are referred to as a second path P2 of level shifter circuit 206. The first path P1 and the second path P2 of level shifter circuit 206 are enabled or disabled by at least input signal IB or IBB.

Other transistor types or number of transistors in level shifter circuit 206 are within the scope of the present disclosure.

Output circuit 208 is an embodiment of output circuit 108 of FIG. 1, and similar detailed description is omitted. Output circuit 208 is configured to receive at least signal SLEEP or first signal SH1. Output circuit 208 is configured to generate at least output signal OUT1 responsive to at least first signal SH1 or signal SLEEP. Output circuit 208 is coupled to at least the level shifter circuit 206, the second voltage supply node 2N or the second node n6 of level shifter circuit 206.

Output circuit 208 comprises PMOS transistors M15 and M16, and NMOS transistors M14, M17 and M18. Each of PMOS transistors M15 and M16, NMOS transistors M14, M17 and M18 is configured to operate in the VDD voltage domain.

NMOS transistor M14 is part of a region 208a of the output circuit 208. PMOS transistors M15 and M16 and NMOS transistors M14 and M17 are part of a region 208b of the output circuit 208.

While NMOS transistor M14 is shown in FIG. 2 as being part of output circuit 208, in some embodiments, NMOS transistor M14 is not part of output circuit 208. For example, in some embodiments, NMOS transistor M14 is part of level shifter circuit 206. In some embodiments, NMOS transistor M14 is not part of either level shifter circuit 206 or output circuit 208.

NMOS transistor M14 is configured to set the voltage of second node n6 which corresponds to first signal SH1. NMOS transistor M14 is coupled between node n6 of level shifter circuit 206 and a node of the reference voltage supply VSS. NMOS transistor M14 is also referred to as a footer circuit.

A source terminal of NMOS transistor M14 is coupled with the node of the reference voltage supply VSS. A bulk or body terminal of NMOS transistor M14 is coupled to the node of the reference voltage supply VSS.

A gate terminal of NMOS transistor M14 is coupled to at least the drain terminal of NMOS transistor M5, the drain terminal of NMOS transistor M6 and the gate terminal of PMOS transistor M7 at node n3. A gate terminal of NMOS transistor M14 is configured to receive the signal SLEEP. NMOS transistor M14 is turned on or off based on signal SLEEP. In response to being turned on by signal SLEEP, NMOS transistor M14 electrically couples node n6 to the node of the reference voltage supply VSS, thereby setting the voltage of node n6 to be equal to the reference voltage supply VSS. In response to being turned off by signal SLEEP, NMOS transistor M14 electrically decouples node n6 and the node of reference voltage supply VSS from each other.

PMOS transistors M15 and M16 and NMOS transistors M17 and M18 are coupled to level shifter circuit 206 and NMOS transistor M14 by the second node n6. PMOS transistors M15 and M16 and NMOS transistors M17 and M18 are configured to generate output signal OUT1 in response to at least the first signal SH1.

Each of the gate terminal of PMOS transistor M15, the gate terminal of PMOS transistor M16, the gate terminal of NMOS transistor M17 and the gate terminal of NMOS transistor M18 are coupled to at least the second node n6 of level shifter circuit 206. Each of the gate terminal of PMOS transistor M15, the gate terminal of PMOS transistor M16, the gate terminal of NMOS transistor M17 and the gate terminal of NMOS transistor M18 is configured to receive the first signal SH1.

Each of PMOS transistor M15, PMOS transistor M16, NMOS transistor M17 and NMOS transistor M18 is configured to be turned on or off based on first signal SH1. In some embodiments, PMOS transistors M15-M16 and NMOS transistor M17-M18 function as an inverter.

For example, in some embodiments, if the first signal SH1 is logically high, then PMOS transistors M15 and M16 are turned off, and NMOS transistors M17 and M18 are turned on, and the output signal OUT1 is logically low. For example, in some embodiments, if the first signal SH1 is logically low, then PMOS transistors M15 and M16 are turned on, and NMOS transistors M17 and M18 are turned off, and the output signal OUT1 is logically high.

A source terminal of PMOS transistor M15 is coupled with second voltage supply node 2N. A drain terminal of PMOS transistor M15 is coupled with a source terminal of PMOS transistor M16. At least a bulk or body terminal of PMOS transistor M15 or a bulk or body terminal of PMOS transistor M16 is coupled to the second voltage supply node 2N.

A drain terminal of PMOS transistor M16 and a drain terminal of NMOS transistor M17 are coupled together, and correspond to an output node ND0 of output circuit 208. The output node ND0 of output circuit 208 has an output signal OUT1.

A source terminal of NMOS transistor M17 and a drain terminal of NMOS transistor M18 are coupled to each other. A source terminal of NMOS transistor M18 is coupled with at least the reference supply node VSS. At least a bulk or body terminal of NMOS transistor M17 or a bulk or body terminal of NMOS transistor M18 is coupled to the reference voltage supply VSS.

Other transistor types or number of transistors in output circuit 208 are within the scope of the present disclosure.

Circuit 200 is configured to operate in a first mode or a second mode. For example, in the first mode, the level shifter circuit 206 is enabled or awake, and the output signal OUT1 corresponds to a level shifted version of the input signal IN. In the second mode, the level shifter circuit 206 is disabled or in sleep mode, and the output signal OUT1 is a high logical value or a low logical value.

In some embodiments, level shifter circuit 206 is enabled or turned on by signal NSLEEP being equal to a high logical value (e.g. "1"). In some embodiments, level shifter circuit 206 is disabled or turned off by signal NSLEEP being equal to a low logical value (e.g. "0"). Other values for signal NSLEEP that cause level shifter circuit 206 to be enabled or turned on are within the scope of the present disclosure. Other values for signal NSLEEP that cause level shifter circuit 206 to be disabled or turned off are within the scope of the present disclosure.

In some embodiments, when the level shifter circuit 206 is disabled or in sleep mode, and NMOS transistor M14 is enabled or turned on, then the circuit 200 is configured to output a high logical value (e.g. "1") regardless of the values of at least input signal IN, IBB or IBB. For example, in some embodiments, if signal NSLEEP has a low logical value (e.g. "0"), then signal SLEEP has a high logical value (e.g. "1"), thereby causing PMOS transistor M7 and the level shifter circuit 206 to be disabled, and thereby causing NMOS transistor M14 to be enabled or turned on. In response to NMOS transistor M14 being enabled or turned on, then NMOS transistor M14 will pull the voltage of node n6 towards the reference voltage VSS, thereby setting the voltage of the first signal SH1 to be equal to a low logical value. In response to the voltage of the first signal SH1 being equal to a low logical value, PMOS transistors M15 and M16 turn on and will pull the voltage of the output node ND0 towards the second supply voltage VDD, thereby setting the voltage of the output signal OUT1 to be equal to a high logical value.

In some embodiments, when the level shifter circuit 206 is enabled or awake, and NMOS transistor M14 is disabled or turned off, then the circuit 200 is configured to output an output signal OUT that corresponds to a level shifted version (e.g., first signal SH1) of the input signal IN.

For example, in some embodiments, if signal NSLEEP has a high logical value (e.g. "1"), then signal SLEEP has a low logical value (e.g. "0"), thereby causing PMOS transistor M7 and the level shifter circuit 206 to be enabled, and causing NMOS transistor M14 to be disabled or turned off.

In response to PMOS transistor M7 being enabled or turned on, then PMOS transistor M7 will pull the voltage of node n4 towards the second supply voltage VDD, thereby setting the voltage of node n4 (e.g., signal CCHD) to be equal to the second supply voltage VDD. In response to NMOS transistor M14 being disabled or turned off, then NMOS transistor M14 will not set the voltage of node n6. In these embodiments, the voltage of node n6 will be set by either (1) NMOS transistor M13 or (2) PMOS transistors M7, M9 and M11 based upon the value of the input signal IN.

For example, in these embodiments, when input signal IN has a high logical value (e.g. "1"), then input signal IB has a low logical value (e.g. "0"), and input signal IBB has a high logical value (e.g. "1").

In response to the input signal IBB being a high logical value (e.g. "1"), causes NMOS transistor M13 to turn on, and thereby pulls the voltage of the second node n6 towards the towards the reference voltage VSS, thereby setting the voltage of the first signal SH1 to be equal to a low logical value. In response to the voltage of the first signal SH1 being equal to a low logical value, PMOS transistors M15 and M16 turn on and will pull the voltage of the output node ND0 towards the second supply voltage VDD, thereby setting the voltage of the output signal OUT1 to be equal to a high logical value. Thus, when the input signal IN has a high logical value (e.g. "1") in the VDDL domain, the output signal OUT1 is a level shifted version of the input signal IN, and is equal to a high logical value in the VDD domain.

For example, in these embodiments, when input signal IN has a low logical value (e.g. "0"), then input signal IB has a high logical value (e.g. "1"), and input signal IBB has a low logical value (e.g. "0").

In response to the input signal IB being a high logical value (e.g. "1"), and causes PMOS transistor M10 to turn off and causes NMOS transistor M12 to turn on, thereby causing NMOS transistor M12 to pull the voltage of the first node n5 towards the reference voltage VSS, and setting the voltage of the gate of PMOS transistor M9 to be equal to a low logical value.

In response to the voltage of the gate of PMOS transistor M9 to be equal to a low logical value, causes PMOS transistor M9 to turn on thereby coupling node n4 to the source terminal of PMOS transistor M11.

In response to the input signal IBB being a low logical value (e.g. "0"), causes NMOS transistor M13 to turn off, and PMOS transistor M11 to turn on. However, since node n4 is electrically coupled to the source terminal of PMOS transistor M11, turning on PMOS transistor M11 thereby causes node n4 to be electrically coupled to the second node n6. By electrically coupling node n4 to the second node n6, thereby causes one or more of PMOS transistors M7, M9 and M11 to pull the voltage of the second node n6 towards the second supply voltage VDD, thereby setting the voltage of the first signal SH1 to be equal to a high logical value.

In response to the voltage of the first signal SH1 being equal to a high logical value, NMOS transistors M17 and M18 turn on and will pull the voltage of the output node ND0 towards the reference supply voltage VSS, thereby setting the voltage of the output signal OUT1 to be equal to a low logical value. Thus, when the input signal IN has a low logical value (e.g. "0") in the VDDL domain, the output signal OUT1 is a level shifted version of the input signal IN, and is equal to a low logical value in the VDD domain.

Other values for signal NSLEEP and signal SLEEP, transistors types or configurations in level shifter circuit 206 and output circuit 208 are within the scope of the present disclosure.

Each of the transistors in circuit 202 have a corresponding threshold voltage. In some embodiments, a threshold voltage of a transistor device is related to one or more of a work function difference between a channel of a transistor and the gate electrode of the transistor, an amount of p-type or n-type dopants in the transistor device or a thickness of a gate oxide of the corresponding gate in the transistor device, or the like.

For example, in some embodiments, by increasing the work function difference between the channel of an NMOS transistor and the gate electrode of the NMOS transistor causes the threshold voltage of the NMOS transistor to be increased, and vice versa. For example, in some embodiments, by increasing the work function difference between the channel of an PMOS transistor and the gate electrode of the PMOS transistor causes the threshold voltage of the PMOS transistor to be decreased, and vice versa.

For example, in some embodiments, by decreasing the thickness of the gate oxide of the transistor device causes the threshold voltage of the transistor device to be decreased.

For example, in some embodiments, by increasing the P-type dopant concentration of the channel in an NMOS transistor causes the threshold voltage to be increased. In some embodiments, by increasing the N-type dopant concentration of the channel in an NMOS transistor causes the threshold voltage to be decreased.

In some embodiments, each of the transistors in the input circuit 202 have a first threshold voltage. In some embodiments, a first threshold voltage corresponds to a standard threshold voltage. In some embodiments, each of the transistors in the input circuit 202 correspond to standard threshold voltage devices.

In some embodiments, each of the transistors in region 206b of the level shifter circuit 206 have a second threshold voltage. In some embodiments, a second threshold voltage corresponds to a high threshold voltage. In some embodiments, each of the transistors in region 206b of the level shifter circuit 206 correspond to high threshold voltage devices.

In some embodiments, each of the transistors in the enable circuit 204, the output circuit 208 and region 206a of level shifter circuit 206 have a third threshold voltage. In some embodiments, a third threshold voltage corresponds to an ultra-high threshold voltage. In some embodiments, each of the transistors in the enable circuit 204, the output circuit 208 and region 206a of level shifter circuit 206 correspond to ultra-high threshold voltage devices.

In some embodiments, the first threshold voltage is less than the second threshold voltage and the third threshold voltage. In some embodiments, the second threshold voltage is less than the third threshold voltage.

In some embodiments, NMOS transistors M2 and M4 with the first threshold voltage have a corresponding first work function difference, NMOS transistors M6, M14, M17 and M18 with the second threshold voltage have a corresponding second work function difference, and NMOS transistors M12 and M13 with the third threshold voltage have a corresponding third work function difference. In some embodiments, the first work function difference is less than the second work function difference and the third work function difference. In some embodiments, the second work function difference is less than the third work function difference.

In some embodiments, PMOS transistors M1 and M3 with the first threshold voltage have a corresponding fourth work function difference, and PMOS transistors M5, M7, M8, M9, M10, M11, M15 and M16 with the second threshold voltage have a corresponding fifth work function difference. In some embodiments, the fourth work function difference is greater than the fifth work function difference.

In some embodiments, NMOS transistors M2 and M4 with the first threshold voltage have a corresponding first gate oxide thickness, NMOS transistors M6, M14, M17 and M18 with the second threshold voltage have a corresponding second gate oxide thickness, and NMOS transistors M12 and M13 with the third threshold voltage have a corresponding third gate oxide thickness. In some embodiments, the first gate oxide thickness is less than the second gate oxide thickness and the third gate oxide thickness. In some embodiments, the second gate oxide thickness is less than the third gate oxide thickness.

In some embodiments, PMOS transistors M1 and M3 with the first threshold voltage have a corresponding fourth gate oxide thickness, and PMOS transistors M5, M7, M8, M9, M10, M11, M15 and M16 with the second threshold voltage have a corresponding fifth gate oxide thickness. In some embodiments, the fourth gate oxide thickness is less than the fifth gate oxide thickness.

In some embodiments, NMOS transistors M2 and M4 with the first threshold voltage have a corresponding first P-type dopant concentration of the channel, NMOS transistors M6, M14, M17 and M18 with the second threshold voltage have a corresponding second P-type dopant concentration of the channel, and NMOS transistors M12 and M13 with the third threshold voltage have a corresponding third P-type dopant concentration of the channel. In some embodiments, the first P-type dopant concentration of the channel is less than the second P-type dopant concentration of the channel and the third P-type dopant concentration of the channel. In some embodiments, the second P-type dopant concentration of the channel is less than the third P-type dopant concentration of the channel.

In some embodiments, by configuring the level shifter circuit 206 to have regions 206a and 206b with different threshold voltages reduces the leakage current in the first path P1 or the second path P2, thereby reducing the power consumption of circuit 200 compared with other approaches that have higher leakage current and greater power consumption.

In some embodiments, by configuring the level shifter circuit 206 with a header circuit (e.g., PMOS transistor M7) reduces the leakage current in the first path P1 or the second path P2 when the level shifter circuit 206 is disabled or is in sleep mode, thereby reducing the power consumption of circuit 200 compared with other approaches that have higher leakage current and greater power consumption.

In some embodiments, by configuring circuit 200 with a header circuit (e.g., PMOS transistor M7) reduces the number of transistors in circuit 200, thereby reducing the power consumption of circuit 200 compared with other approaches that have higher leakage current and greater power consumption.

FIGS. 3A-3D are diagrams of an integrated circuit 300, in accordance with some embodiments.

Integrated circuit 300 is an embodiment of integrated circuit 100 of FIG. 1 or circuit 200 in FIG. 2, and similar detailed description is therefore omitted.

For ease of illustration, some of the labeled elements of one or more of FIGS. 3A-3D are not labelled in one or more of FIGS. 3A-3D. In some embodiments, integrated circuit 300 includes additional elements not shown in FIGS. 3A-3D.

Figure 3A:
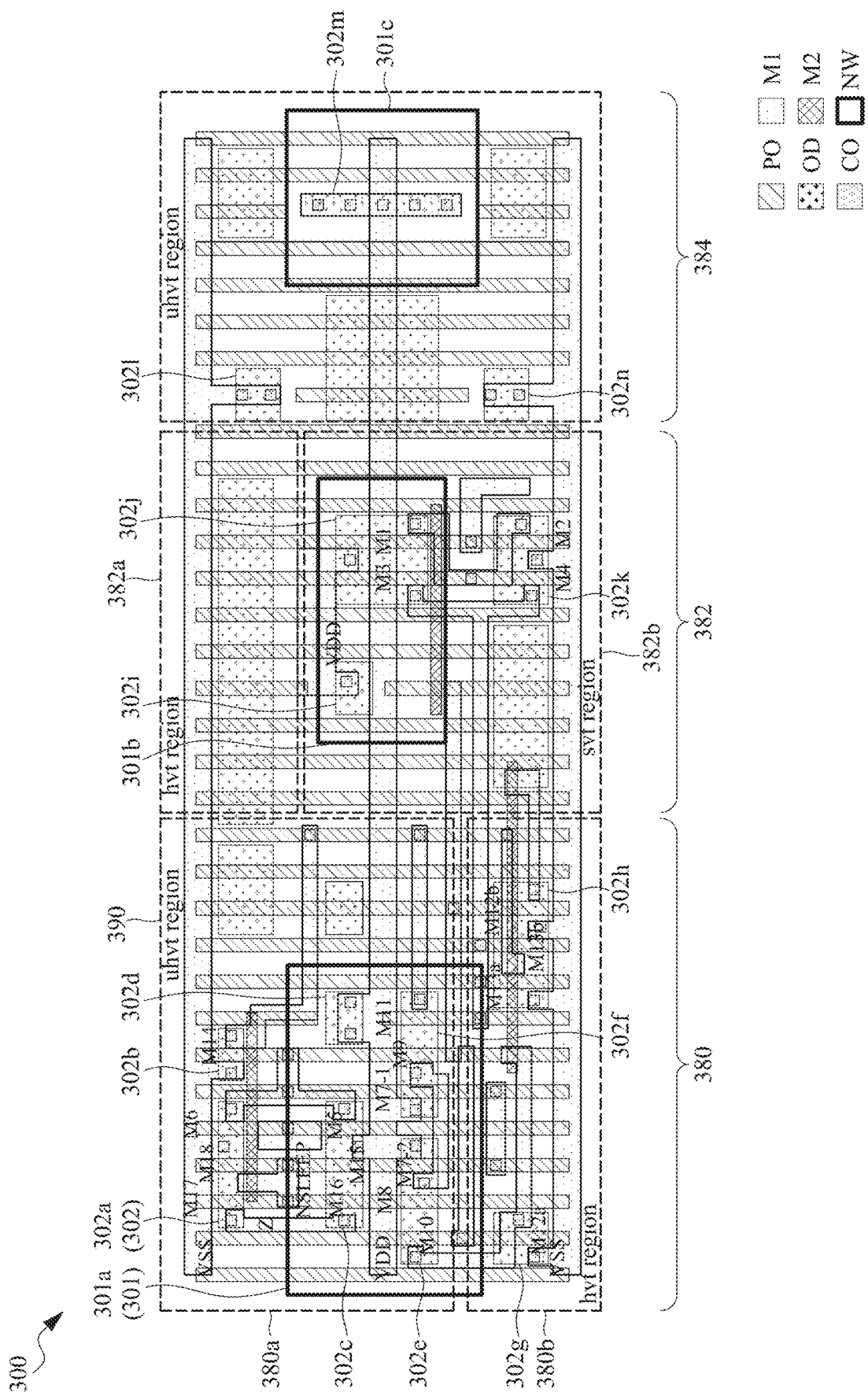
FIGS. 3A-3D are diagrams of an integrated circuit, in accordance with some embodiments.
Figure 3B:
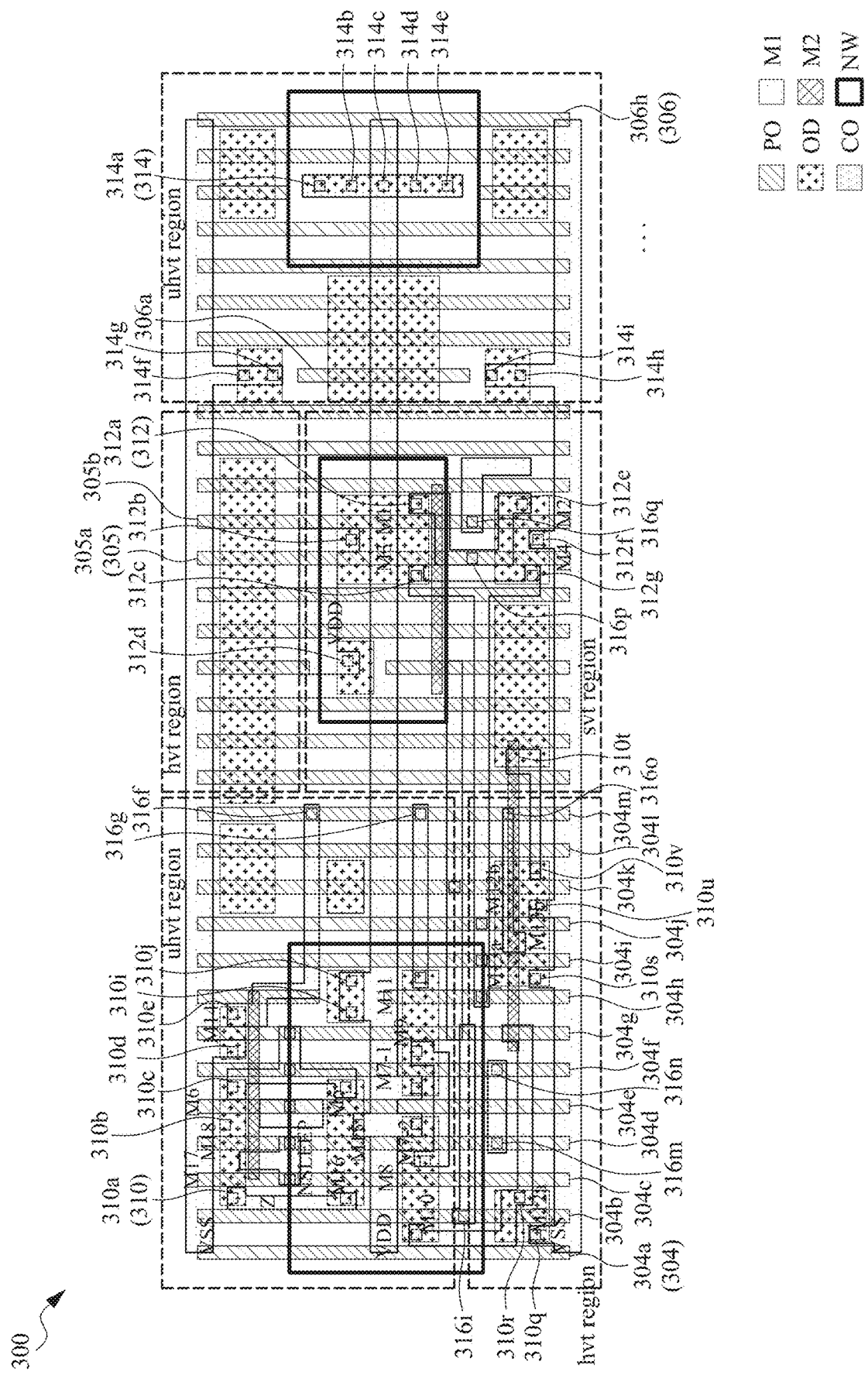
Figure 3C:
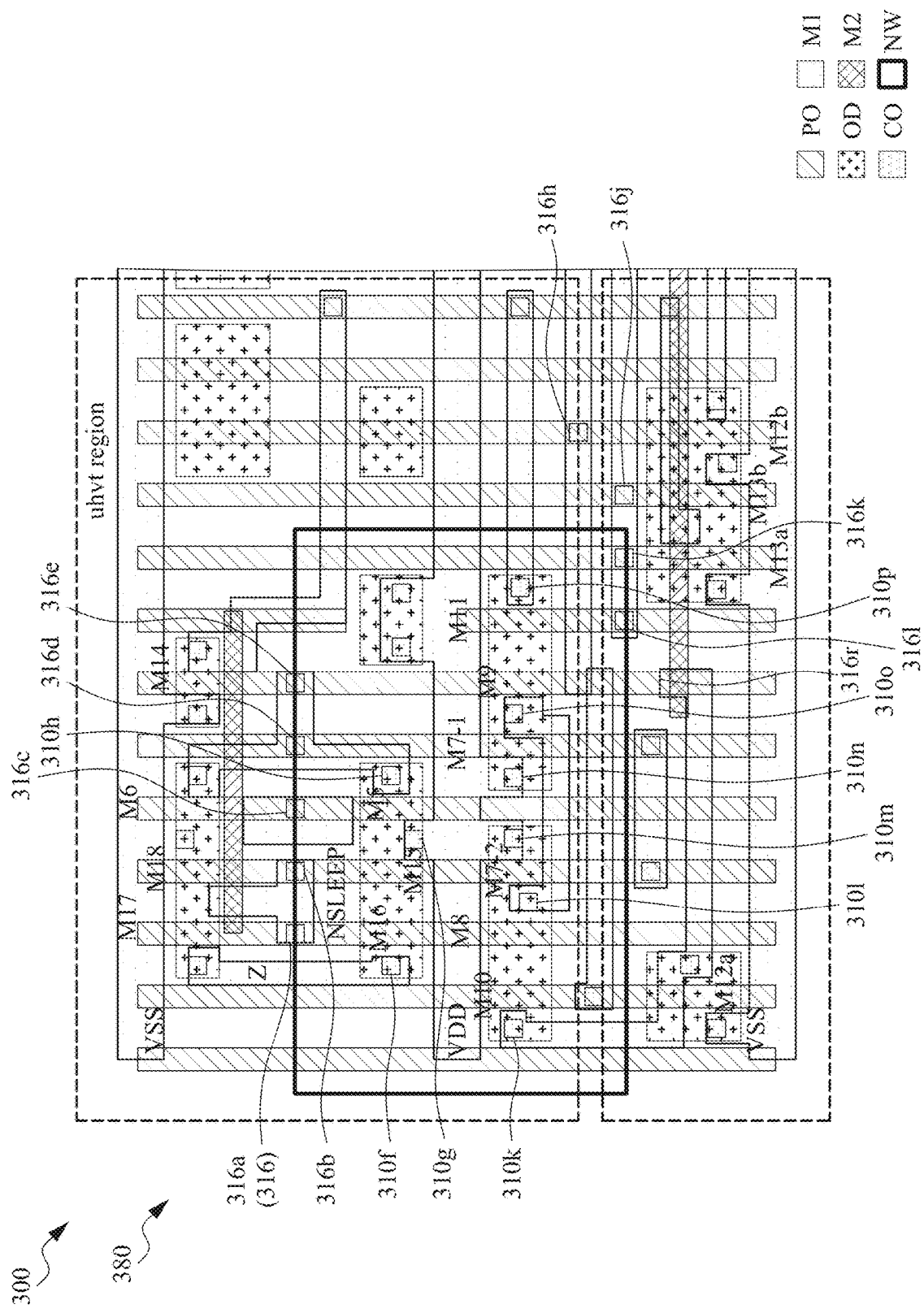
Figure 3D:
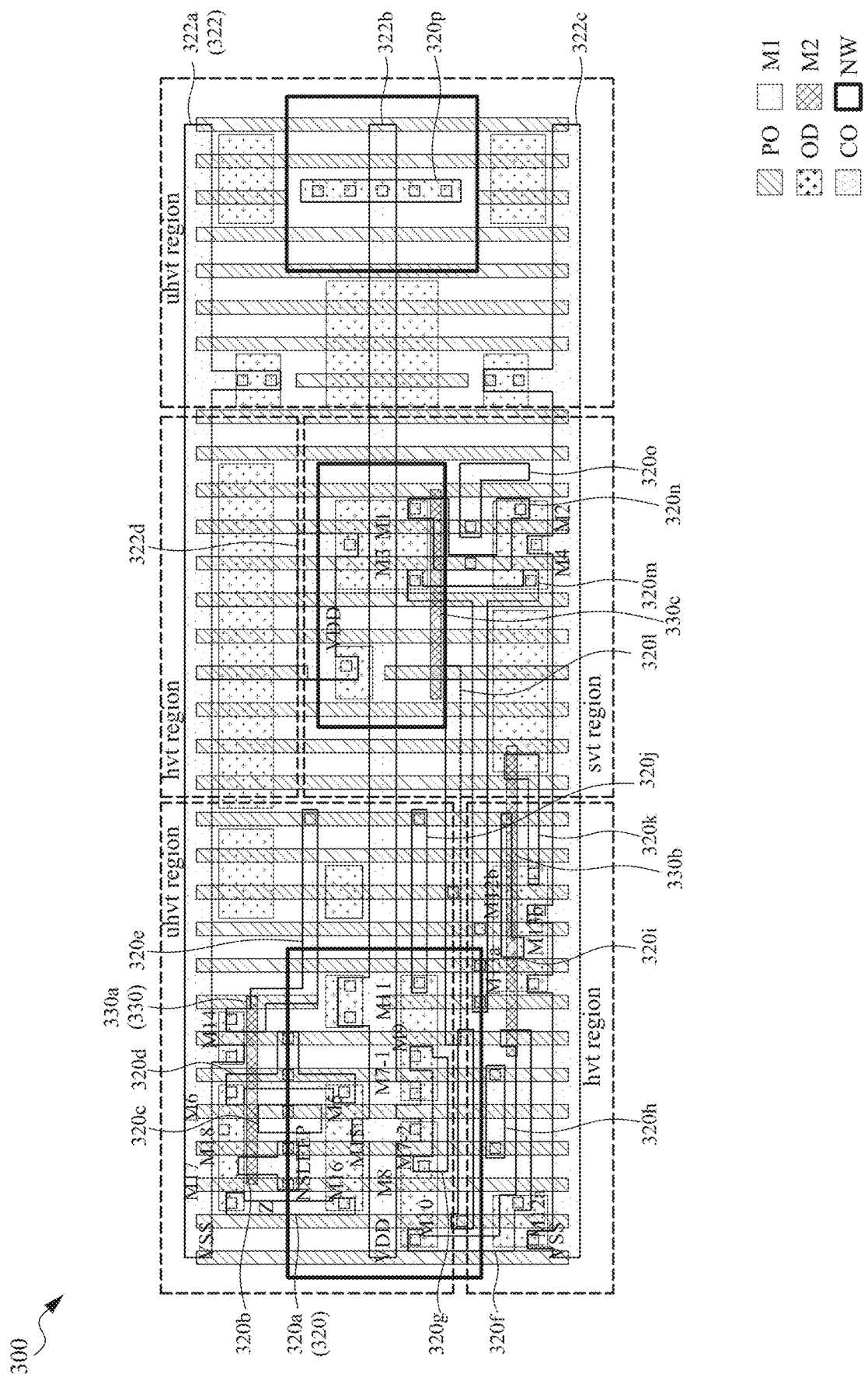

FIGS. 3A, 3B and 3D are a top-level view of integrated circuit 300, in accordance with some embodiments. FIG. 3C is a region 380 of integrated circuit 300, simplified for ease of illustration.

For ease of illustration, each of the elements of integrated circuit 300 are not labelled in FIGS. 3A, 3B, 3C and 3D. For example, one or more elements in the N-well level of integrated circuit 300 and an oxide diffusion (OD) level or an active level of integrated circuit 300 are labelled in FIG. 3A. For example, one or more elements in the POLY level of integrated circuit 300, a via over gate (VG) level of integrated circuit 300, and a via over diffusion (VD) level of integrated circuit 300 are labelled in FIG. 3B. For example, one or more elements in the VG level of region 380 of integrated circuit 300, and the VD level of region 380 of integrated circuit 300 are labelled in FIG. 3C. For example, one or more elements in a metal 0 (M0) level of integrated circuit 300 and a metal 1 (M1) level of integrated circuit 300 are labelled in FIG. 3D.

Integrated circuit 300 is manufactured by a corresponding layout design similar to integrated circuit 300. For brevity FIGS. 3A-3D are described as a corresponding integrated circuit 300, but in some embodiments, FIGS. 3A-3D further correspond to layout designs having features similar to integrated circuit 300, and structural elements of integrated circuit 300 further correspond to layout patterns, and structural relationships including alignment, lengths and widths, as well as configurations and layers of a corresponding layout design of integrated circuit 300 are similar to the structural relationships and configurations and layers of integrated circuit 300, and similar detailed description will not be described for brevity.

For purposes of brevity and succinctness, common reference numerals and elements to the FIGS. 3A, 3B, 3C, and 3D retain the same number. Further, discussion on these elements is not presented again to avoid repetition. Differences between the figures are called out with separate, new reference numerals, and discussion of the differences.

Integrated circuit 300 includes regions 380a and 380b (collectively referred to as a "region 380"), regions 382a and 382b (collectively referred to as a "region 382"), and region 384. In some embodiments, region 380a corresponds to enable circuit 204, region 206a and output circuit 208 of FIG. 2, and similar detailed description will not be described for brevity. In some embodiments, region 380b corresponds to region 206b of FIG. 2, and similar detailed description will not be described for brevity. In some embodiments, region 382b corresponds to input circuit 202 of FIG. 2, and similar detailed description will not be described for brevity.

Integrated circuit 300 includes a substrate 390 and a set of wells 301. The substrate 390 includes the set of wells 301. The set of wells 301 extends in a first direction (e.g., X-axis), and is in substrate 390. The set of wells 301 have a first dopant type. The first dopant type is an N-type dopant. In some embodiments, the n-type dopants include phosphorus, arsenic or other suitable n-type dopants. In some embodiments, the set of wells 301 comprises p-type dopants. In some embodiments, the p-dopants include boron, aluminum or other suitable p-type dopants. The substrate 390 has a dopant type opposite of the dopant type of the set of wells 301. In some embodiments, the substrate 390 has the first dopant type.

The set of wells 301 includes well 301a, well 301b and well 301c. Each well of the set of wells 301 is separated from each other in the first direction X. Each well of the set of wells 301 corresponds to one or more PMOS transistors in integrated circuit 200.

Integrated circuit 300 further includes a set of active regions 302. The set of active regions 302 include one or more of active regions 302a, 302b, . . . , 302l or 302m embedded in substrate 390.

The set of active regions 302 extend in the first direction X. Each active region of the set of active regions 302 is separated from each other in the first direction or a second direction Y. In some embodiments, the set of active regions 302 is referred to as an oxide diffusion (OD) region which defines the source or drain diffusion regions of integrated circuit 200.

In some embodiments, the set of active regions 302 is located on a first level. In some embodiments, the first level corresponds to an active level or an OD level of integrated circuit 200.

The NMOS transistor M12 of FIG. 2 is shown in integrated circuit 300 as NMOS transistor M12a and NMOS transistor M12b, the NMOS transistor M13 of FIG. 2 is shown in integrated circuit 300 as NMOS transistor M13a and NMOS transistor M13b, and the PMOS transistor M7 of FIG. 2 is shown in integrated circuit 300 as PMOS transistor M7_1 and PMOS transistor M7_2, and similar detailed description will not be described for brevity.

In some embodiments, active region 302a corresponds to source and drain regions of NMOS transistors M17, M18 and M6 of circuit 200, active region 302b corresponds to source and drain regions of NMOS transistor M14 of circuit 200, active region 302c corresponds to source and drain regions of PMOS transistors M16, M15 and M5 of circuit 200, active region 302d corresponds to bulk/tap regions of PMOS transistors M10, M8, M7_2, M7_1, M9 and M11 of circuit 200, active region 302e corresponds to source and drain regions of PMOS transistors M10, M8 and M7_2 of circuit 200, active region 302f corresponds to source and drain regions of PMOS transistors M7_1, M9 and M11 of circuit 200, active region 302g corresponds to source and drain regions of NMOS transistor M12a, active region 302h corresponds to source and drain regions of NMOS transistors M13a, M13b and M12b of circuit 200, active region 302i corresponds to bulk/tap regions of PMOS transistors M3 and M1 of circuit 200, active region 302j corresponds to source and drain regions of NMOS transistors M3 and M1 of circuit 200, active region 302k corresponds to source and drain regions of PMOS transistors M4 and M2 of circuit 200, active region 302l corresponds to bulk/tap regions of NMOS transistors M17, M18, M6 and M14 of circuit 200, active region 302m corresponds to bulk/tap region of circuit 200, active region 302n corresponds to bulk/tap regions of NMOS transistors M12a, M13a, M13b and M12b of circuit 200, and similar detailed description will not be described for brevity. Other transistor types and source/drain regions are within the scope of the present disclosure.

Active regions 302c, 302d, 302e and 302f are within well 301a. Active regions 302i and 302j are within well 301b. Active region 302m is within well 301c.

Other configurations, arrangements on other layout levels or quantities of structures in the set of active regions 302 are within the scope of the present disclosure.

Integrated circuit 300 further includes a set of gates 304, 305 and 306.

The set of gates 304 include one or more of gates 304a, 304b, ..., 304l or 304m.

The set of gates 305 include one or more of gates 305a, 305b, ..., 305j or 305k.

The set of gates 306 include one or more of gates 306a, 306b, ..., 306g or 306h.

The set of gates 304, 305, and 306 extend in the second direction Y. Each gate of the set of gates 304 is separated from an adjacent gate pattern of the set of gates 304 in the first direction X by a first pitch (not labelled). Each gate of the set of gates 305 is separated from an adjacent gate pattern of the set of gates 305 in the first direction X by a first pitch (not labelled). Each gate of the set of gates 306 is separated from an adjacent gate pattern of the set of gates 306 in the first direction X by a first pitch (not labelled).

In some embodiments, gate 304b is a gate of each of NMOS transistor M12a and PMOS transistor M10.

In some embodiments, gate 304c is a gate of each of NMOS transistor M8, NMOS transistor M17 and PMOS transistor M16.

In some embodiments, gate 304d is a gate of each of NMOS transistor M7_2, NMOS transistor M18 and PMOS transistor M15.

In some embodiments, gate 304e is a gate of each of NMOS transistor M6 and PMOS transistor M5.

In some embodiments, gate 304f is a gate of PMOS transistor M7_1.

In some embodiments, gate 304g is a gate of each of NMOS transistor M14 and PMOS transistor M9.

In some embodiments, gate 304h is a gate of PMOS transistor M11. In some embodiments, gate 304i is a gate of NMOS transistor M13a. In some embodiments, gate 304j is a gate of NMOS transistor M13b. In some embodiments, gate 304k is a gate of PMOS transistor M12b.

In some embodiments, gate 305a is a gate of each of NMOS transistor M4 and PMOS transistor M3. In some embodiments, gate 305b is a gate of each of NMOS transistor M2 and PMOS transistor M1.

In some embodiments, at least one or more gates of the set of gates 304, 305 or 306 corresponds to a dummy gate. In some embodiments, a dummy gate is a gate of a non-functional transistor. For example, gate 304a is a dummy gate.

The set of gates 304, 305 and 306 are above the set of active regions 302. The set of gates 304, 305 and 306 are positioned on a second level different from the first level. In some embodiments, the second level is different from the first level. In some embodiments, the second level corresponds to the POLY level of integrated circuit 300. In some embodiments, the POLY level is above the OD level.

Other configurations, arrangements on other layout levels or quantities of gates in the set of gates 304, 305 and 306 are within the scope of the present disclosure.

Integrated circuit 300 further includes a set of contacts 310, 312 and 314.

The set of contacts 310 include one or more of contacts 310a, 310b, ..., 310u or 310v.

The set of contacts 312 include one or more of contacts 312a, 312b, ..., 312f or 312g.

The set of contacts 314 include one or more of contacts 314a, 314b, ..., 314h or 314i.

The set of contacts 310, 312 or 314 extend in the first direction X or the second direction Y. Each of the contacts of the set of contacts 310, 312 or 314 is separated from an adjacent contact of the set of contacts 310, 312 or 314 in at least the first direction X or the second direction Y.

The set of contacts 310, 312 or 314 overlap the set of active regions 302. The set of contacts is located on a third level. In some embodiments, the third level corresponds to the contact level or a metal over diffusion (MD) level of integrated circuit 300. In some embodiments, the third level is above the second level. In some embodiments, the third level is different from the first level. In some embodiments, one or more contacts in the set of contacts 310, 312 or 314 is a corresponding via in a via over diffusion (VD) level of integrated circuit 300.

The set of contacts 310, 312 or 314 are configured to electrically couple the set of active regions 302 and a set of conductors 320 together. The set of contacts 310, 312 or 314 are located between the set of active regions 302 and the set of conductors 320.

Each contact of the set of contacts 310 corresponds to one or more drain or source terminals or bulk terminals of PMOS or NMOS transistors of circuit 200. In some embodiments, one or more contacts of the set of contacts 312 corresponds to one or more drain or source terminals or bulk terminals of PMOS or NMOS transistors of circuit 200.

In some embodiments, contact 310a is a drain terminal of NMOS transistor M17, contact 310b is a source terminal of each of NMOS transistors M18 and M6, and contact 310c is a drain terminal of NMOS transistor M6.

In some embodiments, contact 310d is a source terminal of NMOS transistor M14 and contact 310e is a drain terminal of NMOS transistor M14.

In some embodiments, contact 310f is a drain terminal of PMOS transistor M16, contact 310g is a source terminal of each of PMOS transistors M15 and M5, and contact 310h is a drain terminal of PMOS transistor M5.

In some embodiments, contact 310k is a drain terminal of PMOS transistor M10, contact 310l is a source terminal of PMOS transistor M8 and a drain terminal of PMOS transistor M7_2, and contact 310m is a source terminal of PMOS transistor M7_2.

In some embodiments, contact 310n is a source terminal of PMOS transistor M7_1, contact 310o is a drain terminal of PMOS transistor M7_1 and a source terminal of PMOS transistor M9, and contact 310p is a drain terminal of PMOS transistor M11.

In some embodiments, contacts 310i and 310j are bulk terminals of PMOS transistors M16, M15, M5, M10, M8, M7_2, M7_1, M9 and M11.

In some embodiments, contact 310q is a source terminal of NMOS transistor M12a, and contact 310r is a drain terminal of NMOS transistor M12a.

In some embodiments, contact 310s is a source terminal of NMOS transistor M13a, contact 310t is a drain terminal of each of NMOS transistors M13a and M13b, contact 310u is a source terminal of each of NMOS transistors M13b and M12b, and contact 310v is a drain terminal of NMOS transistor M12b.

In some embodiments, contact 312a is a source terminal of PMOS transistor M1, contact 312b is a drain terminal of each of PMOS transistors M1 and M3, contact 312c is a source terminal of PMOS transistor M3, and contact 312d is a bulk terminal of PMOS transistors M1 and M3.

In some embodiments, contact 312e is a drain terminal of NMOS transistor M2, contact 312f is a source terminal of each of NMOS transistors M2 and M4, and contact 312g is a drain terminal of NMOS transistor M4.

In some embodiments, contacts 314f and 314g are bulk terminals of NMOS transistors M17, M18, M6 and M14. In some embodiments, contacts 314h and 314i are bulk terminals of NMOS transistors M12a, M13a, M13b, M12b, M4 and M2.

In some embodiments, one or more contacts of the set of contacts 310, 312 or 314 overlaps a corresponding active region of the set of active regions 302, thereby electrically coupling the corresponding contact of the set of contacts 310, 312 or 314 and the source or drain of the corresponding transistors.

Other lengths or widths for the set of contacts 310, 312 or 314 are within the scope of the present disclosure. Other configurations, arrangements on other layout levels or quantities of conductors in the set of contacts 310, 312 or 314 are within the scope of the present disclosure.

Integrated circuit 300 further includes a set of vias 316.

The set of vias 316 include one or more of vias 316a, 316b, . . . , 316q or 316r.

The set of vias 316 extend in the first direction X or the second direction Y. Each of the vias of the set of vias 316 is separated from an adjacent via of the set of vias 316 in at least the first direction X or the second direction Y.

The set of vias 316 overlap one or more of the set of gates 304, 305 or 306. The set of vias is located on a fourth level. In some embodiments, the fourth level corresponds to a via over gate (VG) level of integrated circuit 300. In some embodiments, the fourth level is above the first level and the second level. In some embodiments, the fourth level is on a same level as the third level. In some embodiments, one or more vias in the set of vias 316 is a corresponding gate contact of integrated circuit 300.

The set of vias 316 are configured to electrically couple the set of gates 304, 305 or 306 and the set of conductors 320 together. The set of vias 316 are between the set of gates 304, 305 or 306 and the set of conductors 320.

Each via of the set of vias 316 corresponds to one or more vias over one or more gates of the PMOS or NMOS transistors of circuit 200.

In some embodiments, one or more vias of the set of vias 316 is over a corresponding gate of the set of gates 304, 305 or 306, thereby electrically coupling the corresponding via of the set of vias 316 and the gate of the corresponding transistors.

Other lengths or widths for the set of vias 316 are within the scope of the present disclosure. Other configurations, arrangements on other layout levels or quantities of conductors in the set of vias 316 are within the scope of the present disclosure.

Integrated circuit 300 further includes a set of conductors 320.

The set of conductors 320 include one or more of conductors 320a, 320b, 320c, . . . , 320o or 320p extending in at least the first direction X or the second direction Y.

Each conductor of the set of conductors 320 is separated from one another in at least the first direction X or the second direction Y.

The set of conductors 320 overlap the set of gates 304, 305 or 306, the set of active regions 302, the set of contacts 310, 312, 314 and the set of vias 316. In some embodiments, the set of conductors 320 is on a fifth level. In some embodiments, the fifth level is different from the first level, the second level, the third level and the fourth level. In some embodiments, the fifth level corresponds to the M1 level of integrated circuit 300. In some embodiments, the M1 level is above the OD level, the POLY level, the MD level, the VG level and the VD level, and below the M2 level. Other levels are within the scope of the present disclosure. In some embodiments, the fifth level corresponds to the M0 level of integrated circuit 300.

The set of conductors 320 overlap the set of gates 304, 305 or 306, the set of active regions 302, the set of contacts 310, 312, 314 and the set of vias 316. The set of conductors 320 electrically connect one or more of the set of gates 304, 305 or 306, the set of active regions 302, the set of contacts 310, 312, 314 and the set of vias 316 together. The set of conductors 320 is configured to provide the routing of signals between the set of gates 304, 305 or 306, the set of active regions 302, the set of contacts 310, 312, 314 and the set of vias 316.

Conductor 320a corresponds to an output pin of integrated circuit 300, and is an embodiment of output node ND0 of FIG. 2. Conductor 320a is configured to electrically couple the drain of NMOS transistor M17 and the drain of PMOS transistor M16. For example, conductor 320a is electrically coupled to the drain of NMOS transistor M17 by contact 310a, and conductor 320a is electrically coupled to the drain of PMOS transistor M16 by contact 310f.

Conductor 320b corresponds to an input terminal of region 208b of FIG. 2. Conductor 320b is configured to electrically couple the gate 304c of NMOS transistor M17 and PMOS transistor M16, and the gate 304d of NMOS transistor M18 and PMOS transistor M15 together. For example, conductor 320b is electrically coupled to the gate 304c of NMOS transistor M17 and PMOS transistor M16 by via 316a, and conductor 320b is electrically coupled to the gate 304d of NMOS transistor M18 and PMOS transistor M15 by via 316b.

Conductor 320c corresponds to an input pin of enable circuit 204 of FIG. 2, and is configured to receive signal NSLEEP. Conductor 320c is electrically coupled to the gate of NMOS transistor M6 and the gate of PMOS transistor M5 by via 316c.

Conductor 320d corresponds to an output pin of enable circuit 204, and is an embodiment of node n3 of FIG. 2. Conductor 320d is configured to electrically couple each of the drain of NMOS transistor M6, the drain of PMOS transistor M5, the gate of PMOS transistor M7_1 and gate of PMOS transistor M14 together. For example, conductor 320d is electrically coupled to the drain of NMOS transistor M6 by contact 310c, and conductor 320d is electrically coupled to the drain of PMOS transistor M5 by contact 310h. For example, conductor 320d is also electrically coupled to the gate 304f of PMOS transistor M7_1 by via 316d, and conductor 320d is electrically coupled to the gate 304g of PMOS transistor M14 by via 316e.

In some embodiments, conductor 330a corresponds to node n6. Conductor 330a is electrically coupled to conductor 320e by a via in the V1 layer (not labelled), and conductor 330a is electrically coupled to conductor 320b by a via in the V1 layer (not labelled).

Conductor 320e is electrically coupled to the drain of PMOS transistor M14 by contact 310e, and conductor 320e is electrically coupled to gate 304m by via 316f. Gate 304m is electrically coupled to conductor 320*j* by via 316*g*, and is electrically coupled to conductor 320*i* by via 316*o*.

In some embodiments, conductor 320*f*, 320*k* and 330*b* correspond to node n5 of FIG. 2. Conductor 320*f* is configured to electrically couple the gate of PMOS transistor M9, and the drain of NMOS transistor M12*a* and the drain of PMOS transistor M10 together. For example, conductor 320*f* is electrically coupled to the gate 304*g* of PMOS transistor M9 by via 316*r*, and conductor 320*f* is electrically coupled to the drain of NMOS transistor M12*a* by contact 310*r* and the drain of PMOS transistor M10 by contact 310*k*.

Conductor 330*b* is electrically coupled to conductor 320*f* by a via in the V1 layer (not labelled), and conductor 330*b* is electrically coupled to conductor 320*k* by a via in the V1 layer (not labelled). Conductor 320*k* is electrically coupled to the drain of NMOS transistor M12*b* by contact 310*v*.

Conductor 320*g* corresponds to node n4 of FIG. 2. Conductor 320*g* is configured to electrically couple the drain of PMOS transistor M7_2, the source of PMOS transistor M8 to the drain of PMOS transistor M7_1 and the source of PMOS transistor M9. For example, conductor 320*g* is electrically coupled to the drain of PMOS transistor M7_2 and the source of PMOS transistor M8 by contact 310*l*, and conductor 320*g* is electrically coupled to the drain of PMOS transistor M7_1 and the source of PMOS transistor M9 by contact 310*o*.

Conductor 320*h* is electrically coupled to the gate 304*g* of PMOS transistor M7_2 by via 316*m*, and conductor 320*h* is electrically coupled to the gate 304*f* of PMOS transistor M7_1 by via 316*n*.

Conductor 320*i* is electrically coupled to gate 304*m* by via 316*o*, and conductor 320*i* is electrically coupled to the source of NMOS transistor M13*a* and NMOS transistor M13*b* by contact 310*t*.

Conductor 320*j* is electrically coupled to gate 304*m* by via 316*g*, and conductor 320*j* is electrically coupled to the drain of PMOS transistor M11 by contact 310*p*.

Conductor 320*l* is electrically coupled to the gate 304*b* of NMOS transistor M12*a* and PMOS transistor M10 by via 316*i*, and conductor 320*l* is electrically coupled to the gate 304*k* of NMOS transistor M12*b* by via 316*h*, and conductor 320*l* is electrically coupled to conductor 330*c* by a via in the V1 layer (not labelled).

Conductor 330*c* is electrically coupled to conductor 320*l* by a via in the V1 layer (not labelled), and conductor 330*c* is electrically coupled to conductor 320*n* by a via in the V1 layer (not labelled). Conductor 320*n* is electrically coupled to the drain of PMOS transistor M1 by contact 312*a*.

Conductor 320*m* corresponds to node n2 of FIG. 2. Conductor 320*m* is electrically coupled to the gate 304*h* of NMOS transistor M11 by via 316*l*, and conductor 320*m* is electrically coupled to the gate 304*i* of NMOS transistor M13*a* by via 316*k*, and conductor 320*m* is electrically coupled to the gate 304*j* of NMOS transistor M13*b* by via 316*j*, and conductor 320*m* is electrically coupled to the drain of PMOS transistor M3 by contact 312*c*, and conductor 320*m* is electrically coupled to the drain of NMOS transistor M4 by contact 312*g*.

Conductor 320*n* corresponds to node n1 of FIG. 2. Conductor 320*n* is electrically coupled to the gate 305*a* of NMOS transistor M4 and PMOS transistor M3 by via 316*p*, conductor 320*n* is electrically coupled to the drain of PMOS transistor M1 by contact 312*a*, and conductor 320*n* is electrically coupled to the drain of NMOS transistor M2 by contact 312*e*.

Conductor 320*o* corresponds to an input pin of input circuit 202 of FIG. 2, and is configured to receive signal IN.

Conductor 320*o* is electrically coupled to the gate of NMOS transistor M2 and the gate of PMOS transistor M1 by via 316*q*.

Conductor 320*p* is electrically coupled to an active region (not labelled) by contacts 314*a*, 314*b*, 314*c*, 314*d* and 314*e*.

Other configurations, arrangements on other layout levels or quantities of structures in the set of conductors 320 are within the scope of the present disclosure.

Integrated circuit 300 further includes a set of conductors 322.

The set of conductors 322 include one or more of conductors 322*a*, 322*b*, 322*c* or 322*d* extending in at least the first direction X or the second direction Y. In some embodiments, the set of conductors are referred to as a set of power rails.

Each conductor of the set of conductors 322 is separated from one another in at least the first direction X or the second direction Y.

The set of conductors 322 overlap the set of gates 304, 305 or 306, the set of active regions 302, the set of contacts 310, 312, 314 and the set of vias 316. In some embodiments, the set of conductors 322 is on the fifth level.

The set of conductors 322 overlap the set of gates 304, 305 or 306, the set of active regions 302, the set of contacts 310, 312, 314 and the set of vias 316. The set of conductors 322 are configured to supply power (VDDL, VDD or VSS) to one or more of the set of gates 304, 305 or 306, the set of active regions 302, the set of contacts 310, 312, 314 and the set of vias 316.

Conductor 322*a* is configured to supply the reference voltage VSS to the source of NMOS transistors M18 and M6 by contact 310*b*, the source of NMOS transistor M14 by contact 310*d*. Conductor 322*a* is further configured to supply the reference voltage VSS to the bulk terminals of NMOS transistors M17, M18, M6 and M14 by contacts 314*f* and 314*g*.

Conductor 322*a* is electrically coupled to the source of NMOS transistors M18 and M6 by contact 310*b*, and conductor 322*a* is electrically coupled to the source of NMOS transistor M14 by contact 310*d*.

Conductor 322*b* is configured to supply the second supply voltage VDD to the source of PMOS transistor M15 and M5 by contact 310*g*, the source of PMOS transistors M7_2 by contact 310*m*, and the source of PMOS transistors M7_1 by contact 310*n*. Conductor 322*b* is further configured to supply the second supply voltage VDD to the bulk terminals of PMOS transistors M10, M8, M7_2, M7_1, M9 and M11 by contacts 310*i* and 310*j*.

Conductor 322*b* is electrically coupled to the source of PMOS transistor M15 and M5 by contact 310*g*, and conductor 322*b* is electrically coupled to the source of PMOS transistors M7_2 by contact 310*m*, and the source of PMOS transistors M7_1 by contact 310*n*.

Conductor 322*c* is configured to supply the reference voltage VSS to the source of NMOS transistor M12*a* by contact 310*q*, the source of NMOS transistor M13*a* by contact 310*s*, and the source of NMOS transistors M12*b* and M13*b* by contact 310*u*, and the source of NMOS transistors M4 and M2 by contact 312*f*. Conductor 322*c* is further configured to supply the reference voltage VSS to the bulk terminals of NMOS transistors M12*a*, M13*a*, M13*b*, M12*b*, M4 and M2 by contacts 314*h* and 314*i*.

Conductor 322*c* is electrically coupled to the source of NMOS transistor M12*a* by contact 310*q*, and conductor 322*c* is electrically coupled to the source of NMOS transistor M13*a* by contact 310*s*, and conductor 322*c* is electrically coupled to the source of NMOS transistors M13*b* and M13*b* by contact 310*u*, and conductor 322*c* is electrically coupled to the source of NMOS transistors M4 and M2 by contact 312*f*.

Conductor 322*d* is configured to supply the first supply voltage VDDL to the source of PMOS transistor M3 and M1 by contact 312*b*. Conductor 322*d* is further configured to supply the first supply voltage VDDL to the bulk terminals of PMOS transistors M3 and M1 by contact 312*d*.

Conductor 322*d* is electrically coupled to the source of PMOS transistor M3 and M1 by contact 312*b*.

Other configurations, arrangements on other layout levels or quantities of structures in the set of conductors 322 are within the scope of the present disclosure.

Integrated circuit 300 further includes a set of conductors 330.

The set of conductors 330 include one or more of conductors 330*a*, 330*b* or 330*c* extending in at least the first direction X.

Each conductor of the set of conductors 330 is separated from one another in at least the first direction X or the second direction Y.

The set of conductors 330 overlap the set of gates 304, 305 or 306, the set of active regions 302, the set of contacts 310, 312, 314, the set of vias 316 and the set of conductors 320 or 322. In some embodiments, the set of conductors 330 is on a sixth level. In some embodiments, the sixth level is different from the first level, the second level, the third level, the fourth level and the fifth level. In some embodiments, the sixth level corresponds to the M2 level of integrated circuit 300. In some embodiments, the M2 level is above the OD level, the POLY level, the MD level, the VG level, the VD and V1 level and the M1 level. Other levels are within the scope of the present disclosure. In some embodiments, the fifth level corresponds to the M1 or M2 level of integrated circuit 300.

The set of conductors 330 overlap the set of gates 304, 305 or 306, the set of active regions 302, the set of contacts 310, 312, 314, the set of vias 316 and the set of conductors 320 or 322.

Other configurations, arrangements on other layout levels or quantities of structures in the set of conductors 330 are within the scope of the present disclosure.

In some embodiments, at least one gate region of the set of gates 304, 305 or 306 are formed using a doped or non-doped polycrystalline silicon (or polysilicon). In some embodiments, at least one gate region of the set of gates 304, 305 or 306 include a metal, such as Al, Cu, W, Ti, Ta, TiN, TaN, NiSi, CoSi, other suitable conductive materials, or combinations thereof.

In some embodiments, at least one conductor of the set of contacts 310, 312 or 314, at least one conductor of the set of conductors 320, 322 or 330, at least one via of the set of vias 316 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Other materials, configurations, arrangements on other layout levels or quantities of elements in integrated circuit 300 are within the scope of the present disclosure.

In some embodiments, integrated circuit 300 achieves one or more of the benefits discussed in at least FIGS. 1-2 and 4.

FIG. 4 is a circuit diagram of a circuit 400, in accordance with some embodiments. Circuit 400 is an embodiment of integrated circuit 100 of FIG. 1, and similar detailed description is therefore omitted.

Circuit 400 is a variation of circuit 200 of FIG. 2, and similar detailed description is therefore omitted. In comparison with circuit 200 of FIG. 2, enable circuit 404 replaces enable circuit 204, level shifter circuit 406 replaces level shifter circuit 206 and output circuit 408 replaces output circuit 208, and similar detailed description is therefore omitted.

Circuit 400 comprises input circuit 202, an enable circuit 404, a level shifter circuit 406 and an output circuit 408.

In comparison with enable circuit 204 of FIG. 2, enable circuit 404 further includes PMOS transistor M19 and NMOS transistor M20, and similar detailed description is therefore omitted.

Enable circuit 404 includes inverter 204*a* and an inverter 404*a*. Inverter 404*a* includes PMOS transistor M19 and NMOS transistor M20.

Inverter 404*a* is coupled to inverter 204*a* by node n3, and is coupled to level shifter circuit 406 and output circuit 408 by node n7. Inverter 404*a* is configured to receive signal SLEEP from inverter 204*a*, and to output signal NSLEEPD to at least level shifter circuit 406 or output circuit 408. Inverter 404*a* is further coupled to the second voltage supply node 2N. Inverter 404*a* is configured to operate in the VDD voltage domain. Inverter 404*a* is configured to generate signal NSLEEPD in response to signal SLEEP. An input terminal of inverter 404*a* is configured to receive signal SLEEP from inverter 204*a*. An output terminal of inverter 404*a* is configured to output signal NSLEEPD to level shifter circuit 406 and output circuit 408 on node n7. An output terminal of inverter 404*a* is coupled to level shifter circuit 406 and output circuit 408 at node n7.

A gate terminal of PMOS transistor M19 and a gate terminal of NMOS transistor M20 are coupled together, and are configured as an input node (e.g., node n3) of inverter 404*a*. The gate terminal of PMOS transistor M19 and the gate terminal of NMOS transistor M20 are coupled to the drain terminal of PMOS transistor M5 and the drain terminal of NMOS transistor M6 by node n3. The gate terminal of PMOS transistor M19 and the gate terminal of NMOS transistor M20 are configured to receive signal SLEEP.

A source terminal of PMOS transistor M19 is coupled to the second voltage supply node 2N having the second supply voltage VDD. A source terminal of NMOS transistor M20 is coupled to the reference voltage supply VSS. A bulk or body terminal of PMOS transistor M19 is coupled to the second voltage supply node 2N having the second supply voltage VDD. A bulk or body terminal of NMOS transistor M20 is coupled to the reference voltage supply VSS.

A drain terminal of PMOS transistor M19 and a drain terminal of NMOS transistor M20 are coupled together, and are configured as an output node (e.g., node n7) of output circuit 404. The drain terminal of PMOS transistor M19 and the drain terminal of NMOS transistor M20 are configured to output the signal NSLEEPD on node n7.

Other transistor types or number of transistors in enable circuit 404 are within the scope of the present disclosure.

In comparison with level shifter circuit 206 of FIG. 2, level shifter circuit 406 is disabled or enabled in response to signal NSLEEPD.

In comparison with level shifter circuit 206 of FIG. 2, NMOS transistor M21 of level shifter circuit 406 replaces PMOS transistor M7, and similar detailed description is therefore omitted.

Level shifter circuit 206 comprises PMOS transistors M8, M9, M10 and M11 and NMOS transistors M12, M13 and M21. Each of PMOS transistors M8, M9, M10 and M11 and NMOS transistors M12, M13 and M21 is configured to operate in the VDD voltage domain.

PMOS transistors M8, M9, M10 and M11 are part of a region 406*a* of the level shifter circuit 206. NMOS transistors M12, M13 and M21 are part of a region 406*b* of the level shifter circuit 206. Region 406*a* is similar to region 206*a* of FIG. 2, and similar detailed description is therefore omitted. Region 406*b* is similar to region 206*b* of FIG. 2, and similar detailed description is therefore omitted.

In comparison with level shifter circuit 206 of FIG. 2, the gate terminal of NMOS transistor M12 of FIG. 4 and the gate terminal of PMOS transistor M10 of FIG. 4 are configured to receive input signal IBB, and similar detailed description is therefore omitted. NMOS transistor M12 of FIG. 4 is turned on or off based on input signal IBB. PMOS transistor M10 of FIG. 4 is turned on or off based on input signal IBB. Each of the gate terminal of PMOS transistor M10, the gate terminal of NMOS transistor M12, the drain terminal of PMOS transistor M3, the drain terminal of NMOS transistor M4 and node n2 are coupled together.

In comparison with level shifter circuit 206 of FIG. 2, the gate terminal of NMOS transistor M13 of FIG. 4 and the gate terminal of PMOS transistor M11 of FIG. 4 are configured to receive input signal IB, and similar detailed description is therefore omitted. NMOS transistor M13 of FIG. 4 is turned on or off based on input signal IB. PMOS transistor M11 of FIG. 4 is turned on or off based on input signal IB. Each of the gate terminal of PMOS transistor M11, the gate terminal of NMOS transistor M13, the drain terminal of PMOS transistor M1, the drain terminal of NMOS transistor M2 and node n1 are coupled together.

In comparison with level shifter circuit 206 of FIG. 2, by not including PMOS transistor M7 in level shifter circuit 404, the source terminal of PMOS transistor M8, the source terminal of PMOS transistor M9 and node n4 are coupled to the second voltage supply node 2N having the second supply voltage VDD.

In comparison with level shifter circuit 206 of FIG. 2, by including NMOS transistor M21 in level shifter circuit 404, the source terminal of NMOS transistor M12, and the source terminal of PMOS transistor M13 are not directly coupled to the reference voltage supply VSS.

In FIG. 4, the source terminal of NMOS transistor M12 and the source terminal of PMOS transistor M13 are coupled together at a node n8.

NMOS transistor M21 is coupled between node n8 of level shifter circuit 406 and the reference voltage supply VSS. A voltage of the node n8 corresponds to a voltage of signal CCFT. NMOS transistor M21 is also referred to as a footer circuit.

A source terminal of NMOS transistor M21 is coupled with the reference voltage supply VSS having the second supply voltage VDD. Each of a drain terminal of NMOS transistor M21, node n8, the source terminal of NMOS transistor M12 and the source terminal of NMOS transistor M13 are coupled together. A bulk or body terminal of NMOS transistor M21 is coupled to the reference voltage supply VSS.

A gate terminal of NMOS transistor M21 is coupled to at least the drain terminal of PMOS transistor M19 and the drain terminal of NMOS transistor M20 at node n7. The gate terminal of NMOS transistor M21 is configured to receive the signal NSLEEPD. NMOS transistor M21 is turned on or off based on signal NSLEEPD. In response to being turned on by signal NSLEEPD, NMOS transistor M21 electrically couples node n8 to the reference voltage supply VSS, thereby setting the voltage of node n8 to be equal to the reference voltage supply VSS. In response to being turned off by signal NSLEEPD, NMOS transistor M21 electrically decouples node n8 and the reference voltage supply VSS from each other.

Other transistor types or number of transistors in level shifter circuit 406 are within the scope of the present disclosure.

In comparison with output circuit 208 of FIG. 2, PMOS transistor M22 of output circuit 408 replaces NMOS transistor M14, and output circuit 408 further includes PMOS transistors M23 and M24, and NMOS transistors M25 and M26, and similar detailed description is therefore omitted.

Output circuit 408 comprises PMOS transistors M15, M16, M22, M23 and M24, and NMOS transistors M17, M18, M25 and M26. Each of PMOS transistors M15, M16, M22, M23 and M24, and NMOS transistors M17, M18, M25 and M26 is configured to operate in the VDD voltage domain.

Output circuit 408 is configured to receive at least signal NSLEEPD or first signal SH1. Output circuit 408 is configured to generate output signal OUT1 and output signal OUT2 responsive to at least first signal SH1 or signal NSLEEPD. Output circuit 408 is coupled to at least the level shifter circuit 206, the second voltage supply node 2N or the second node n6 of level shifter circuit 406.

While PMOS transistor M22 is shown in FIG. 4 as being part of output circuit 408, in some embodiments, PMOS transistor M22 is not part of output circuit 408. For example, in some embodiments, PMOS transistor M22 is part of level shifter circuit 406. In some embodiments, PMOS transistor M22 is not part of either level shifter circuit 406 or output circuit 408.

PMOS transistor M22 is configured to set the voltage of second node n6 which corresponds to first signal SH1. PMOS transistor M22 is coupled between node n6 of level shifter circuit 406 and a node of the second voltage supply node 2N having the second supply voltage VDD. PMOS transistor M22 is also referred to as a header circuit.

A source terminal of PMOS transistor M22 is coupled with the node of the second voltage supply node 2N having the second supply voltage VDD. A bulk or body terminal of PMOS transistor M22 is coupled to the node of the second voltage supply node 2N having the second supply voltage VDD.

A gate terminal of PMOS transistor M22 is coupled to at least the drain terminal of NMOS transistor M19, the drain terminal of NMOS transistor M20 and the gate terminal of PMOS transistor M19 at node n7. A gate terminal of PMOS transistor M22 is configured to receive the signal NSLEEPD. PMOS transistor M22 is turned on or off based on signal NSLEEPD. In response to being turned on by signal NSLEEPD, PMOS transistor M22 electrically couples node n6 to the node of the second voltage supply node 2N having the second supply voltage VDD, thereby setting the voltage of node n6 to be equal to the second voltage supply node 2N having the second supply voltage VDD. In response to being turned off by signal NSLEEPD, PMOS transistor M22 electrically decouples node n6 and the second voltage supply node 2N having the second supply voltage VDD.

Each of a drain terminal of PMOS transistor M22, node n6, the gate terminal of PMOS transistor M8, the drain terminal of PMOS transistor M11, the drain terminal of NMOS transistor M13, the gate terminal of PMOS transistor M15, the gate terminal of PMOS transistor M16, the gate terminal of NMOS transistor M17 and the gate terminal of NMOS transistor M18 are coupled together.

In comparison with output circuit 208 of FIG. 2, the output node ND0 of output circuit 208 in FIG. 4 is coupled to an input of circuit 408b, and similar detailed description is therefore omitted.

PMOS transistors M23 and M24 and NMOS transistors M25 and M26 are coupled to the drain terminal of PMOS transistor M16, the drain terminal of NMOS transistor M17 and the output node ND0 of output circuit 208. PMOS transistors M23 and M24 and NMOS transistors M25 and M26 are configured to generate output signal OUT2 in response to at least output signal OUT1.

Each of the gate terminal of PMOS transistor M23, the gate terminal of PMOS transistor M24, the gate terminal of NMOS transistor M25 and the gate terminal of NMOS transistor M26 are coupled to at least the drain terminal of PMOS transistor M16, the drain terminal of NMOS transistor M17 and the output node ND0 of output circuit 208.

Each of the gate terminal of PMOS transistor M23, the gate terminal of PMOS transistor M24, the gate terminal of NMOS transistor M25 and the gate terminal of NMOS transistor M26 is configured to receive the output signal OUT1. Each of PMOS transistor M23, PMOS transistor M24, NMOS transistor M25 and NMOS transistor M26 is configured to be turned on or off based on output signal OUT1. In some embodiments, PMOS transistors M23-M24 and NMOS transistor M25-M26 function as an inverter.

For example, in some embodiments, if the output signal OUT1 is logically high, then PMOS transistors M23 and M24 are turned off, and NMOS transistors M25 and M26 are turned on, and the output signal OUT2 is logically low. For example, in some embodiments, if the output signal OUT1 is logically low, then PMOS transistors M23 and M24 are turned on, and NMOS transistors M25 and M26 are turned off, and the output signal OUT2 is logically high.

A source terminal of PMOS transistor M23 is coupled with second voltage supply node 2N. A drain terminal of PMOS transistor M23 is coupled with a source terminal of PMOS transistor M24. At least a bulk or body terminal of PMOS transistor M23 or a bulk or body terminal of PMOS transistor M24 is coupled to the second voltage supply node 2N.

A drain terminal of PMOS transistor M24 and a drain terminal of NMOS transistor M25 are coupled together, and correspond to an output node ND1 of output circuit 408. The output node ND1 of output circuit 408 has an output signal OUT2.

A source terminal of NMOS transistor M25 and a drain terminal of NMOS transistor M26 are coupled to each other. A source terminal of NMOS transistor M26 is coupled with at least the reference voltage supply node VSS. At least a bulk or body terminal of NMOS transistor M25 or a bulk or body terminal of NMOS transistor M26 is coupled to the reference voltage supply VSS.

Other transistor types or number of transistors in output circuit 408 are within the scope of the present disclosure.

Circuit 400 is configured to operate in the first mode or the second mode. For example, in the first mode, the level shifter circuit 406 is enabled or awake, and the output signal OUT2 corresponds to a level shifted version of the input signal IN. In the second mode, the level shifter circuit 406 is disabled or in sleep mode, and the output signal OUT2 is a high logical value or a low logical value.

In some embodiments, level shifter circuit 406 is enabled or turned on by signal NSLEEP being equal to a high logical value (e.g. "1"). In some embodiments, level shifter circuit 406 is disabled or turned off by signal NSLEEP being equal to a low logical value (e.g. "0"). Other values for signal NSLEEP that cause level shifter circuit 406 to be enabled or turned on are within the scope of the present disclosure. Other values for signal NSLEEP that cause level shifter circuit 406 to be disabled or turned off are within the scope of the present disclosure.

In some embodiments, when the level shifter circuit 406 is disabled or in sleep mode, then PMOS transistor M22 is enabled or turned on, and circuit 400 is configured to output a low logical value (e.g. "0") regardless of the values of at least input signal IN, IBB or IBB. For example, in some embodiments, if signal NSLEEP has a low logical value (e.g. "0"), then signal SLEEP has a high logical value (e.g. "1") and signal NSLEEPD has a low logical value (e.g. "0"), thereby causing NMOS transistor M21 and the level shifter circuit 406 to be disabled, and thereby causing PMOS transistor M22 to be enabled or turned on. In response to PMOS transistor M22 being enabled or turned on, then PMOS transistor M22 will pull the voltage of node n6 towards the second supply voltage VDD, thereby setting the voltage of the first signal SH1 to be equal to a high logical value. In response to the voltage of the first signal SH1 being equal to a high logical value, NMOS transistors M17 and M18 turn on and will pull the voltage of the output node ND0 towards the reference voltage VSS, thereby setting the voltage of the output signal OUT1 to be equal to a low logical value. In response to the voltage of the output signal OUT1 being equal to a low logical value causes PMOS transistors M23 and M24 turn on and will pull the voltage of the output node ND1 towards the second supply voltage VDD, thereby setting the voltage of the output signal OUT2 to be equal to a high logical value.

In some embodiments, when the level shifter circuit 406 is enabled or awake, then PMOS transistor M22 is disabled or turned off, and circuit 400 is configured to output an output signal OUT2 that corresponds to a level shifted version (e.g., first signal SH1) of the input signal IN.

For example, in some embodiments, if signal NSLEEP has a high logical value (e.g. "1"), then signal SLEEP has a low logical value (e.g. "0") and signal NSLEEPD has a high logical value (e.g. "1"), thereby causing NMOS transistor M21 and the level shifter circuit 406 to be enabled, and causing PMOS transistor M22 to be disabled or turned off.

In response to NMOS transistor M21 being enabled or turned on, then NMOS transistor M21 will pull the voltage of node n8 towards the reference voltage VSS, thereby setting the voltage of node n8 (e.g., signal CCHD) to be equal to the reference voltage VSS. In response to PMOS transistor M22 being disabled or turned off, then PMOS transistor M22 will not set the voltage of node n6. In these embodiments, the voltage of node n6 will be set by either (1) NMOS transistors M13 and M21 or (2) PMOS transistors M9 and M11 based upon the value of the input signal IN.

For example, in these embodiments, when input signal IN has a low logical value (e.g. "0"), then input signal IB has a high logical value (e.g. "1"), and input signal IBB has a low logical value (e.g. "0"). In response to the input signal IB being a high logical value (e.g. "1"), causes NMOS transistor M13 to turn on and electrically coupling the second node n6 and node n8 together. In some embodiments, by electrically coupling the second node n6 and node n8 together, NMOS transistor M13 and NMOS transistor M21 pull the voltage of the second node n6 towards the reference voltage VSS, thereby setting the voltage of the first signal SH1 to be equal to a low logical value. In response to the voltage of the first signal SH1 being equal to a low logical value, PMOS transistors M15 and M16 turn on and will pull the voltage of the output node ND0 towards the second supply voltage VDD, thereby setting the voltage of the output signal OUT1 to be equal to a high logical value. In response to the voltage of the output signal OUT1 being equal to a high logical value causes NMOS transistors M25 and M26 turn on and will pull the voltage of the output node ND1 towards the reference voltage VSS, thereby setting the voltage of the output signal OUT2 to be equal to a low logical value. Thus, when the input signal IN has a low logical value (e.g. "0") in the VDDL domain, the output signal OUT2 is a level shifted version of the input signal IN, and is equal to a low logical value in the VDD domain.

For example, in these embodiments, when input signal IN has a high logical value (e.g. "1"), then input signal IB has a low logical value (e.g. "0"), and input signal IBB has a high logical value (e.g. "1").

In response to the input signal IBB being a high logical value (e.g. "1"), causes PMOS transistor M10 to turn off and causes NMOS transistor M12 to turn on, thereby electrically coupling the first node n5 and node n8 together. In some embodiments, by electrically coupling the first node n5 and node n8 together, NMOS transistor M12 and NMOS transistor M21 pull the voltage of the first node n5 towards the reference voltage VSS, thereby setting the voltage of the second signal SH2 to be equal to a low logical value, and setting the voltage of the gate of PMOS transistor M9 to be equal to a low logical value. In response to the voltage of the gate of PMOS transistor M9 being equal to a low logical value, causes PMOS transistor M9 to turn on thereby electrically coupling the source terminal of PMOS transistor M11 to node n4 and the second voltage supply VDD.

In response to the input signal IB being a low logical value (e.g. "0"), causes NMOS transistor M13 to turn off, and PMOS transistor M11 to turn on. However, since node n4 and the second voltage supply VDD is electrically coupled to the source terminal of PMOS transistor M11, turning on PMOS transistor M11 thereby causes node n4 and the second voltage supply VDD to be electrically coupled to the second node n6. By electrically coupling node n4 and the second voltage supply VDD to the second node n6, thereby causes one or more of PMOS transistors M9 or M11 to pull the voltage of the second node n6 towards the second supply voltage VDD, thereby setting the voltage of the first signal SH1 to be equal to a high logical value.

In response to the voltage of the first signal SH1 being equal to a high logical value, NMOS transistors M17 and M18 turn on and will pull the voltage of the output node ND0 towards the reference supply voltage VSS, thereby setting the voltage of the output signal OUT1 to be equal to a low logical value. In response to the voltage of the output signal OUT1 being equal to a low logical value causes PMOS transistors M23 and M24 to turn on and will pull the voltage of the output node ND2 towards the second voltage supply VDD, thereby setting the voltage of the output signal OUT2 to be equal to a high logical value. Thus, when the input signal IN has a high logical value (e.g. "1") in the VDDL domain, the output signal OUT2 is a level shifted version of the input signal IN, and is equal to a high logical value in the VDD domain.

Other values for signal NSLEEPD, signal NSLEEP and signal SLEEP, transistors types or configurations in level shifter circuit 406 and output circuit 408 are within the scope of the present disclosure.

In some embodiments, each of the transistors in region 406b of the level shifter circuit 406 have the second threshold voltage. In some embodiments, each of the transistors in region 406b of the level shifter circuit 406 correspond to high threshold voltage devices.

In some embodiments, each of the transistors in the enable circuit 404, the output circuit 408 and region 406a of level shifter circuit 406 have the third threshold voltage. In some embodiments, each of the transistors in the enable circuit 404, the output circuit 408 and region 406a of level shifter circuit 406 correspond to ultra-high threshold voltage devices.

In some embodiments, NMOS transistors M2 and M4 with the first threshold voltage have a corresponding first work function difference, NMOS transistors M6, M17, M18, M20, M25 and M26 with the second threshold voltage have a corresponding second work function difference, and NMOS transistors M12, M13 and M21 with the third threshold voltage have a corresponding third work function difference. In some embodiments, the first work function difference is less than the second work function difference and the third work function difference. In some embodiments, the second work function difference is less than the third work function difference.

In some embodiments, PMOS transistors M1 and M3 with the first threshold voltage have a corresponding fourth work function difference, and PMOS transistors M5, M8, M9, M10, M11, M15, M16, M19, M22, M23 and M24 with the second threshold voltage have a corresponding fifth work function difference. In some embodiments, the fourth work function difference is greater than the fifth work function difference.

In some embodiments, NMOS transistors M2 and M4 with the first threshold voltage have a corresponding first gate oxide thickness, NMOS transistors M6, M17, M18, M20, M25 and M26 with the second threshold voltage have a corresponding second gate oxide thickness, and NMOS transistors M12, M13 and M21 with the third threshold voltage have a corresponding third gate oxide thickness. In some embodiments, the first gate oxide thickness is less than the second gate oxide thickness and the third gate oxide thickness. In some embodiments, the second gate oxide thickness is less than the third gate oxide thickness.

In some embodiments, PMOS transistors M1 and M3 with the first threshold voltage have a corresponding fourth gate oxide thickness, and PMOS transistors M5, M8, M9, M10, M11, M15, M16, M19, M22, M23 and M24 with the second threshold voltage have a corresponding fifth gate oxide thickness. In some embodiments, the fourth gate oxide thickness is less than the fifth gate oxide thickness.

In some embodiments, NMOS transistors M2 and M4 with the first threshold voltage have a corresponding first P-type dopant concentration of the channel, NMOS transistors M6, M17, M18, M20, M25 and M26 with the second threshold voltage have a corresponding second P-type dopant concentration of the channel, and NMOS transistors M12, M13 and M21 with the third threshold voltage have a corresponding third P-type dopant concentration of the channel. In some embodiments, the first P-type dopant concentration of the channel is less than the second P-type dopant concentration of the channel and the third P-type dopant concentration of the channel. In some embodiments, the second P-type dopant concentration of the channel is less than the third P-type dopant concentration of the channel.

In some embodiments, by configuring the level shifter circuit 406 to have regions 406a and 406b with different threshold voltages reduces the leakage current in the first path P1 or the second path P2, thereby reducing the power consumption of circuit 400 compared with other approaches that have higher leakage current and greater power consumption.

In some embodiments, by configuring the level shifter circuit 406 with a footer circuit (e.g., NMOS transistor M21) reduces the leakage current in the first path P1 or the second path P2 when the level shifter circuit 406 is disabled or is in sleep mode, thereby reducing the power consumption of circuit 400 compared with other approaches that have higher leakage current and greater power consumption.

Figure 5A:
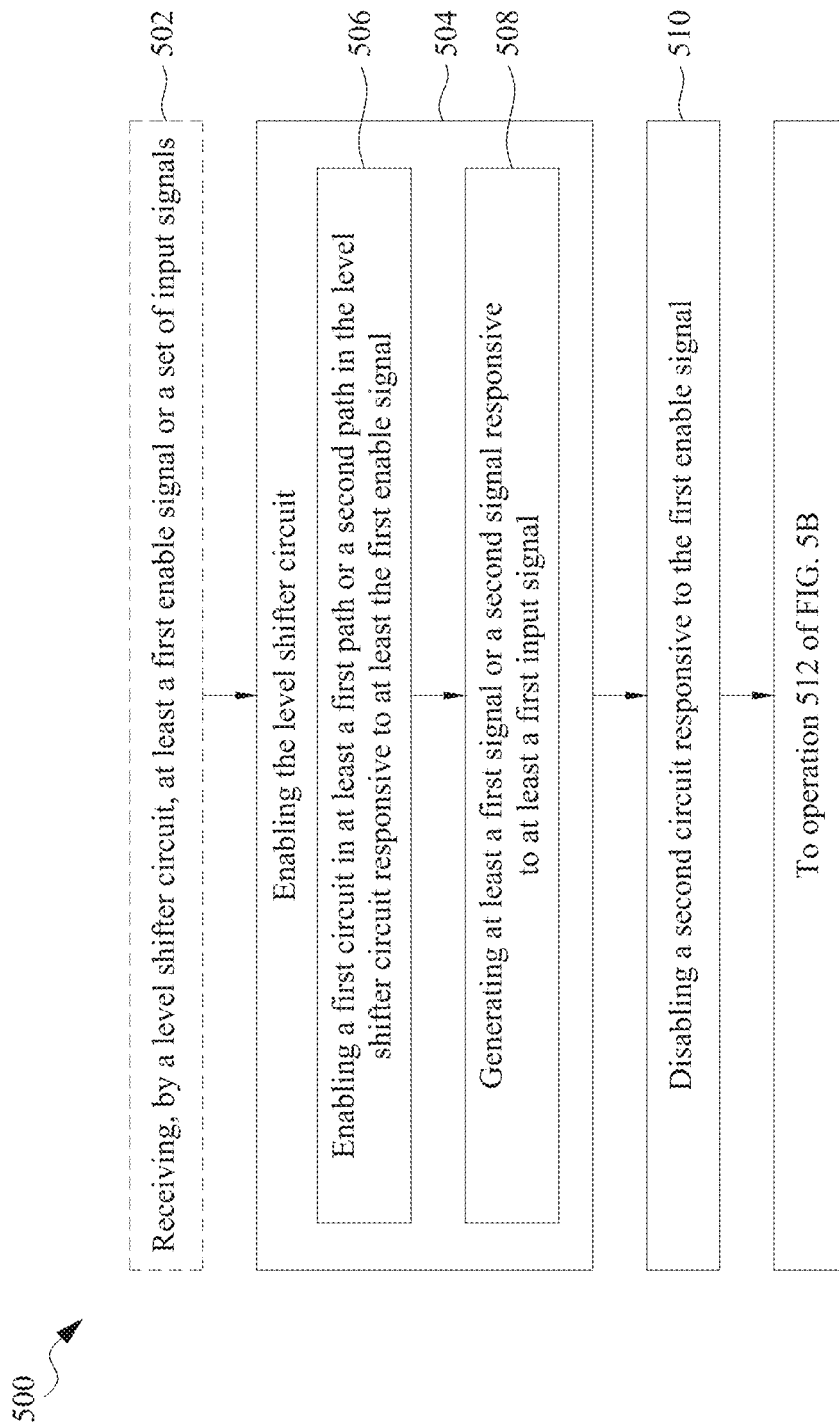
FIGS. 5A-5B are a flowchart of a method of operating a circuit, in accordance with some embodiments.
Figure 5B:
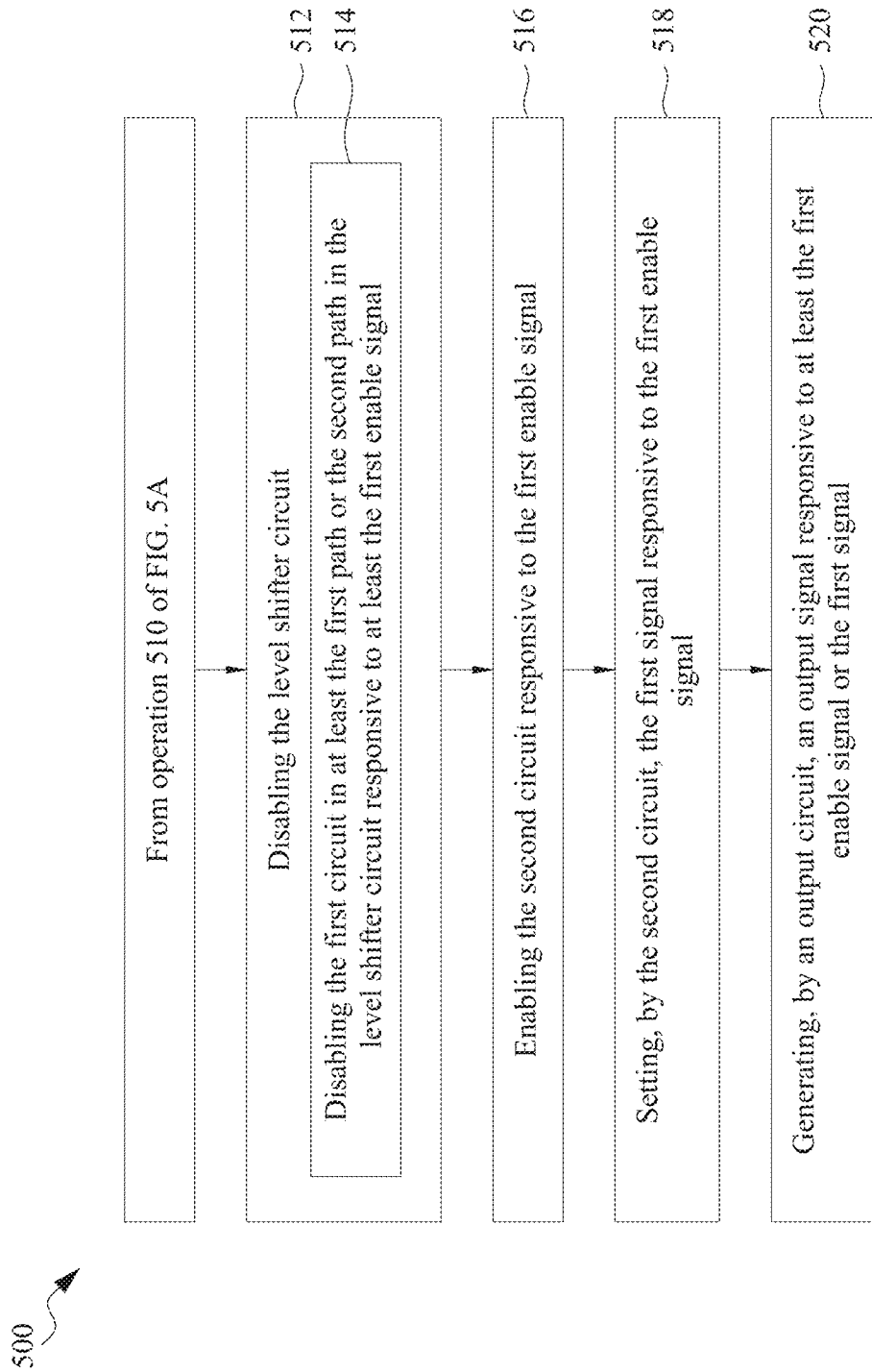

FIGS. 5A-5B are a flowchart of a method 500 of operating a circuit, in accordance with some embodiments. It is understood that additional operations may be performed before, during, and/or after the method 500 depicted in FIGS. 5A-5B, and that some other processes may only be briefly described herein. It is understood that method 500 utilizes features of one or more of integrated circuit 100 or 300 of corresponding FIG. 1 or 3A-3D, circuit 200 or 400 of corresponding FIG. 2 or 4. In some embodiments, method 500 is a method of operating at least integrated circuit 100 or 300, or at least circuit 200 or 400.

In operation 502 of method 500, at least a first enable signal or a set of input signals is received by a level shifter circuit 206 or 406. In some embodiments, the first enable signal includes at least signal SLEEP or signal NSLEEPD. In some embodiments, the set of input signals includes at least input signal IB or input signal IBB.

In operation 504 of method 500, the level shifter circuit is enabled responsive to the first enable signal. In some embodiments, operation 504 includes at least one or more of operations 506 or 508.

In operation 506 of method 500, a first circuit in at least a first path or a second path in the level shifter circuit is enabled responsive to at least the first enable signal thereby electrically coupling the first path or the second path to a first voltage supply (e.g., VDD) or a first reference supply (e.g., VSS).

In some embodiments, the first circuit of method 500 includes at least PMOS transistor M7 or NMOS transistor M21. In some embodiments, the first path of method 500 includes at least path P1. In some embodiments, the second path of method 500 includes at least path P2.

In operation 508 of method 500, a first signal is generated responsive to at least a first input signal. In some embodiments, the first signal of method 500 includes at least signal SH1 or signal SH2. In some embodiments, the first input signal of method 500 includes at least input signal IB or input signal IBB. In some embodiments, the first input signal has a first voltage swing. In some embodiments, the first signal has a second voltage swing different from the first voltage swing.

In operation 510 of method 500, a second circuit is disabled responsive to the first enable signal. In some embodiments, the second circuit of method 500 includes at least PMOS transistor M22 or NMOS transistor M14. In some embodiments, the second circuit is coupled to a first output node (e.g., node n6) of the level shifter circuit.

In operation 512 of method 500, the level shifter circuit is disabled responsive to the first enable signal. In some embodiments, operation 512 includes at least one or more of operations 514.

In operation 514 of method 500, the first circuit in at least the first path or the second path in the level shifter circuit is disabled responsive to at least the first enable signal thereby electrically decoupling the first path or the second path from the first voltage supply (e.g., VDD) or the first reference supply (e.g., VSS).

In operation 516 of method 500, the second circuit is enabled responsive to the first enable signal.

In operation 518 of method 500, the first signal is set responsive to enabling the second circuit. In some embodiments, the first signal is set by the second circuit responsive to operation 516.

In operation 520 of method 500, an output signal is generated responsive to at least the first enable signal or the first signal. In some embodiments, the output signal of operation 520 is generated by output circuit 208 or 408. In some embodiments, the output signal of method 500 includes at least output signal OUT1 or output signal OUT2.

In some embodiments, one or more of the operations of method 500 is not performed.

Furthermore, various PMOS or NMOS transistors shown in FIGS. 2-4 are of a particular dopant type (e.g., N-type or P-type) for illustration purposes. Embodiments of the disclosure are not limited to a particular transistor type, and one or more of the PMOS or NMOS transistors shown in FIGS. 2-4 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in input circuit 202 is within the scope of various embodiments. Selecting different numbers of inverters in enable circuit 204 or 404 is within the scope of various embodiments. Selecting different numbers of transistors in output circuit 208 or 408 is within the scope of various embodiments. Selecting different numbers of transistors in circuit 200, 300 or 400 is within the scope of various embodiments.

FIG. 6 is a flowchart of a method 600 of forming or manufacturing an integrated circuit in accordance with some embodiments. It is understood that additional operations may be performed before, during, and/or after the method 600 depicted in FIG. 6, and that some other operations may only be briefly described herein. In some embodiments, the method 600 is usable to form integrated circuits, such as at least integrated circuit 100 or 300 or at least circuit 200 or 400.

In operation 602 of method 600, a layout design of an integrated circuit is generated. Operation 602 is performed by a processing device (e.g., processor 802 (FIG. 8)) configured to execute instructions for generating a layout design. In some embodiments, the layout design of method 600 includes one or more structures or features similar to at least integrated circuit 300. In some embodiments, the layout design of the present application is in a graphic database system (GDSII) file format.

In operation 604 of method 600, the integrated circuit is manufactured based on the layout design. In some embodiments, operation 604 of method 600 comprises manufacturing at least one mask based on the layout design, and manufacturing the integrated circuit based on the at least one mask.

In some embodiments, operation 604 results in the formation of integrated circuit 300. In some embodiments, at least one of operations 602 or 604 is not performed.

Figure 7:
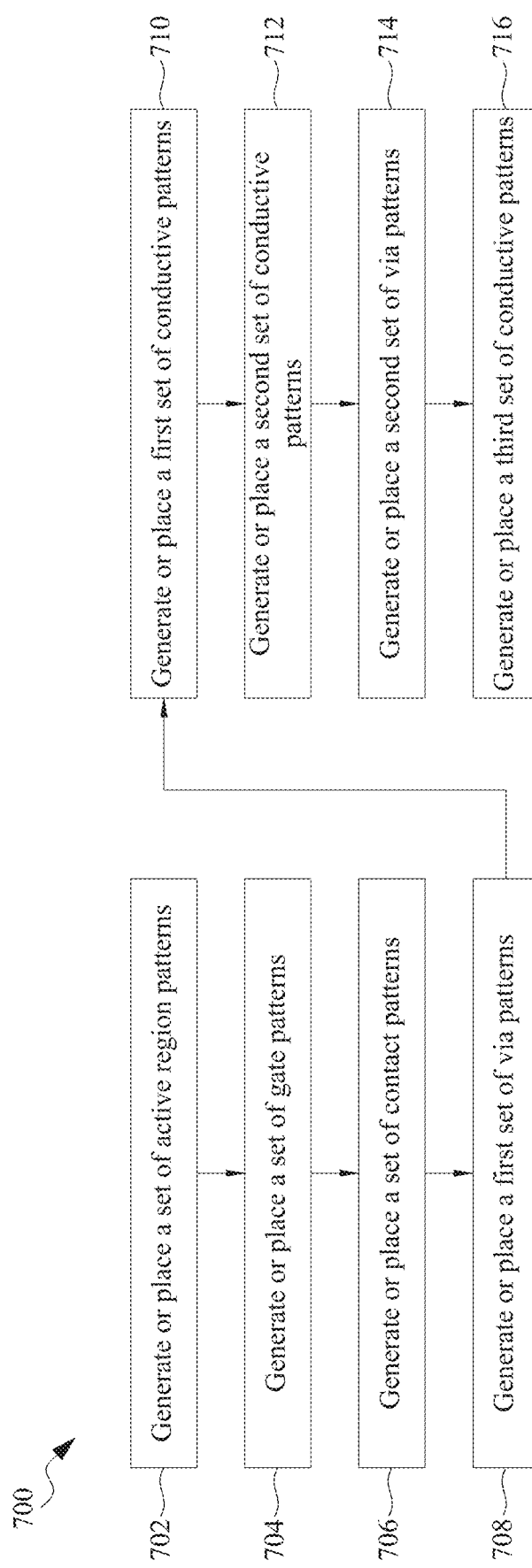
FIG. 7 is a flowchart of a method of generating a layout design of an integrated circuit, in accordance with some embodiments.

FIG. 7 is a flowchart of a method 700 of generating a layout design of an integrated circuit, in accordance with some embodiments. It is understood that additional operations may be performed before, during, and/or after the method 700 depicted in FIG. 7, and that some other processes may only be briefly described herein. In some embodiments, method 700 is an embodiment of operation 602 of method 600. In some embodiments, method 700 is usable to generate one or more layout patterns similar to at least integrated circuit 300.

In some embodiments, method 700 is usable to generate one or more layout patterns having structural relationships including alignment, lengths and widths, as well as configurations and layers of at least integrated circuit 300, and similar detailed description will not be described in FIG. 7, for brevity.

In operation 702 of method 700, a set of active region patterns is generated or placed on the layout design. In some embodiments, the set of active region patterns of method 700 includes one or more regions similar to the set of active regions 302. In some embodiments, the set of active region patterns of method 700 includes one or more active regions in the OD layer.

In operation 704 of method 700, a set of gate patterns is generated or placed on the layout design. In some embodiments, the set of gate patterns of method 700 includes one or more gate patterns similar to at least the set of gates 304, 305 or 306. In some embodiments, the set of gate patterns of method 700 includes one or more gates in the POLY layer.

In operation 706 of method 700, a set of contact patterns is generated or placed on the layout design. In some embodiments, the set of contact patterns of method 700 includes one or more contacts similar to at least the set of contacts 310, 312 or 314. In some embodiments, the set of contact patterns of method 700 includes one or more vias in the VD layer similar to the set of contacts 310, 312 or 314.

In operation 708 of method 700, a first set of via patterns is generated or placed on the layout design. In some embodiments, the first set of via patterns of method 700 includes one or more via patterns similar to at least the set of vias 316. In some embodiments, the first set of via patterns of method 700 includes one or more vias similar to at least vias in the VG layer.

In operation 710 of method 700, a first set of conductive patterns is generated or placed on the layout design. In some embodiments, the first set of conductive patterns of method 700 includes one or more conductors similar to at least the set of conductors 320. In some embodiments, the first set of conductive patterns of method 700 includes one or more conductors similar to at least conductors in the M0 or M1 layer.

In operation 712 of method 700, a second set of conductive patterns is generated or placed on the layout design. In some embodiments, the second set of conductive patterns of method 700 includes one or more conductors similar to at least the set of conductors 322. In some embodiments, the second set of conductive patterns of method 700 includes one or more conductors similar to at least conductors in the M0 or M1 layer.

In operation 714 of method 700, a second set of via patterns is generated or placed on the layout design. In some embodiments, the second set of via patterns of method 700 includes one or more via patterns similar to vias between the M0 and M1 layer, or between the M1 and M2 layer. In some embodiments, the second set of via patterns of method 700 includes one or more vias similar to at least vias in the V1 layer.

In operation 716 of method 700, a third set of conductive patterns is generated or placed on the layout design. In some embodiments, the third set of conductive patterns of method 700 includes one or more conductors similar to at least the set of conductors 330. In some embodiments, the third set of conductive patterns of method 700 includes one or more conductors similar to at least conductors in the M1 or M2 layer.

One or more of the operations of methods 600-700 is performed by a processing device configured to execute instructions for manufacturing an integrated circuit, such as at least integrated circuit 300. In some embodiments, one or more operations of methods 600-700 is performed using a same processing device as that used in a different one or more operations of methods 600-700. In some embodiments, a different processing device is used to perform one or more operations of methods 600-700 from that used to perform a different one or more operations of methods 600-700. In some embodiments, other order of operations of method 500, 600 or 700 is within the scope of the present disclosure. Method 500, 600 or 700 includes exemplary operations, but the operations are not necessarily performed in the order shown. Operations in method 500, 600 or 700 may be added, replaced, changed order, and/or eliminated as appropriate, in accordance with the spirit and scope of disclosed embodiments.

Figure 8:
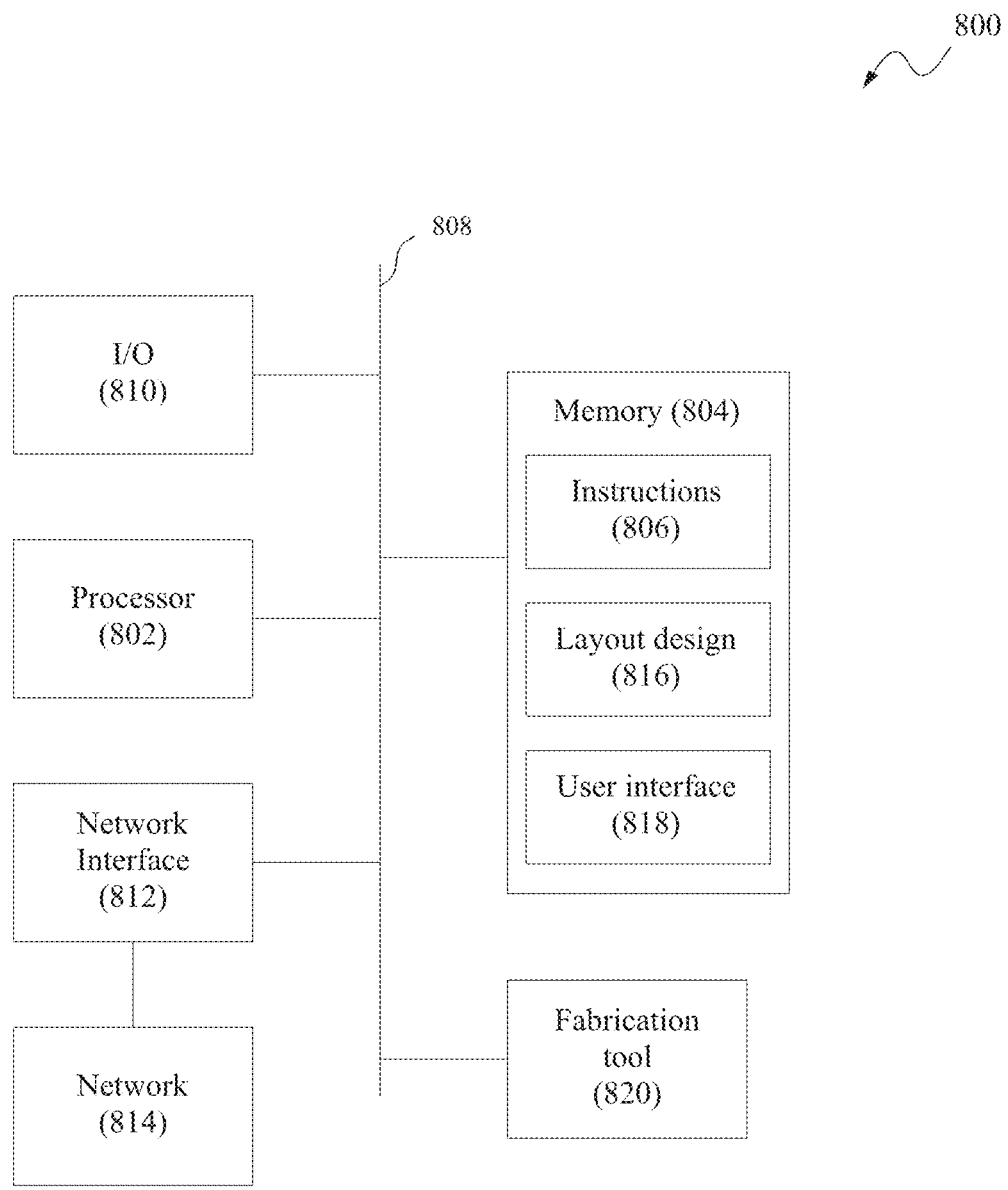
FIG. 8 is a schematic view of a system for designing an IC layout design and manufacturing an IC circuit, in accordance with some embodiments.

FIG. 8 is a schematic view of a system 800 for designing an IC layout design and manufacturing an IC circuit, in accordance with some embodiments.

In some embodiments, system 800 generates or places one or more IC layout designs described herein. System 800 includes a hardware processor 802 and a non-transitory, computer readable storage medium 804 (e.g., memory 804) encoded with, i.e., storing, the computer program code 806, i.e., a set of executable instructions 806. Computer readable storage medium 804 is configured for interfacing with manufacturing machines for producing the integrated circuit. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described in method 600-700.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform method 600-700. In some embodiments, the storage medium 804 also stores information needed for performing method 600-700 as well as information generated during performing method 600-700, such as layout design 816, user interface 818 and fabrication tool 820, and/or a set of executable instructions to perform the operation of method 600-700. In some embodiments, layout design 816 comprises one or more of layout patterns of at least layout design 100 or 300, or features similar to at least integrated circuit 300.

In some embodiments, the storage medium 804 stores instructions (e.g., computer program code 806) for interfacing with manufacturing machines. The instructions (e.g., computer program code 806) enable processor 802 to generate manufacturing instructions readable by the manufacturing machines to effectively implement method 600-700 during a manufacturing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-2094. In some embodiments, method 600-700 is implemented in two or more systems 800, and information such as layout design, and user interface are exchanged between different systems 800 by network 814.

System 800 is configured to receive information related to a layout design through I/O interface 810 or network interface 812. The information is transferred to processor 802 by bus 808 to determine a layout design for producing at least integrated circuit 300. The layout design is then stored in computer readable medium 804 as layout design 816. System 800 is configured to receive information related to a user interface through I/O interface 810 or network interface 812. The information is stored in computer readable medium 804 as user interface 818. System 800 is configured to receive information related to a fabrication tool 820 through I/O interface 810 or network interface 812. The information is stored in computer readable medium 804 as fabrication tool 820. In some embodiments, the fabrication tool 820 includes fabrication information utilized by system 800. In some embodiments, the fabrication tool 820 corresponds to mask fabrication 934 of FIG. 9.

In some embodiments, method 600-700 is implemented as a standalone software application for execution by a processor. In some embodiments, method 600-700 is implemented as a software application that is a part of an additional software application. In some embodiments, method 600-700 is implemented as a plug-in to a software application. In some embodiments, method 600-700 is implemented as a software application that is a portion of an EDA tool. In some embodiments, method 600-700 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 600-700 is implemented by a manufacturing device to manufacture an integrated circuit using a set of masks manufactured based on one or more layout designs generated by system 800. In some embodiments, system 800 is a manufacturing device configured to manufacture an integrated circuit using a set of masks manufactured based on one or more layout designs of the present disclosure. In some embodiments, system 800 of FIG. 8 generates layout designs of an integrated circuit that are smaller than other approaches. In some embodiments, system 800 of FIG. 8 generates layout designs of integrated circuit structure that occupy less area and provide better routing resources than other approaches.

Figure 9:
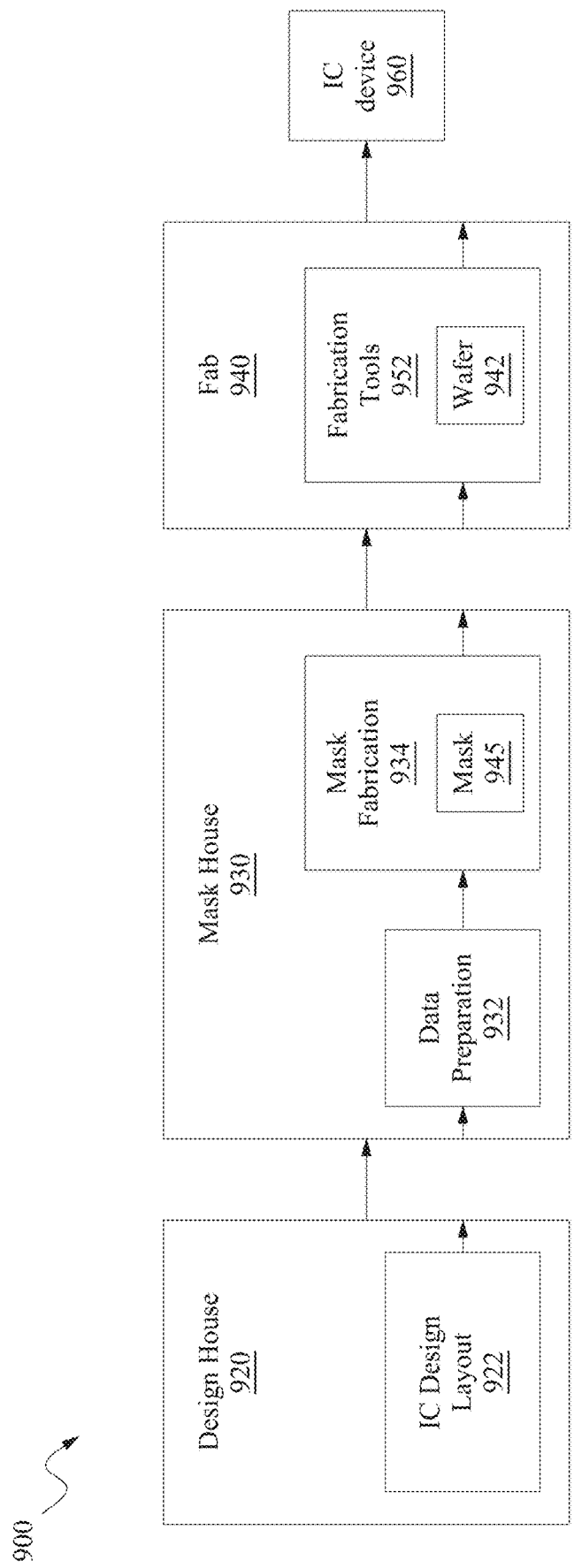
FIG. 9 is a block diagram of an IC manufacturing system, and an IC manufacturing flow associated therewith, in accordance with at least one embodiment of the present disclosure.

FIG. 9 is a block diagram of an integrated circuit (IC) manufacturing system 900, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 (hereinafter "system 900") includes entities, such as a design house 920, a mask house 930, and an IC manufacturer/fabricator ("fab") 940, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 920, mask house 930, and IC fab 940 is owned by a single larger company. In some embodiments, one or more of design house 920, mask house 930, and IC fab 940 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout 922. The design procedure includes one or more of logic design, physical design or place and route. IC design layout 922 is presented in one or more data files having information of the geometrical patterns. For example, IC design layout 922 can be expressed in a GDSII file format or DFII file format.

Mask house 930 includes data preparation 932 and mask fabrication 934. Mask house 930 uses IC design layout 922 to manufacture one or more masks 945 to be used for fabricating the various layers of IC device 960 according to IC design layout 922. Mask house 930 performs mask data preparation 932, where IC design layout 922 is translated into a representative data file (RDF). Mask data preparation 932 provides the RDF to mask fabrication 934. Mask fabrication 934 includes a mask writer. A mask writer converts the RDF to an image on a substrate, such as a mask (reticle) 945 or a semiconductor wafer 942. The design layout 922 is manipulated by mask data preparation 932 to comply with particular characteristics of the mask writer and/or requirements of IC fab 940. In FIG. 9, mask data preparation 932 and mask fabrication 934 are illustrated as separate elements. In some embodiments, mask data preparation 932 and mask fabrication 934 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 940 to fabricate IC device 960. LPC simulates this processing based on IC design layout 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 922.

It should be understood that the above description of mask data preparation 932 has been simplified for the purposes of clarity. In some embodiments, data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 945 or a group of masks 945 are fabricated based on the modified IC design layout 922. In some embodiments, mask fabrication 934 includes performing one or more lithographic exposures based on IC design 922. In some embodiments, an electron-beam (e-beam) or a mechanism of multiple e-beams is used to form a pattern on a mask (photomask or reticle) 945 based on the modified IC design layout 922. The mask 945 can be formed in various technologies. In some embodiments, the mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 945 includes a transparent substrate (e.g., fused quartz) and an opaque material (e.g., chromium) coated in the opaque regions of the binary mask. In another example, the mask 945 is formed using a phase shift technology. In the phase shift mask (PSM) version of mask 945, various features in the pattern formed on the mask are configured to have proper phase difference to enhance the resolution and imaging quality. In various examples, the phase shift mask can be attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 940 is an IC fabrication entity that includes one or more manufacturing facilities for the fabrication of a variety of different IC products. In some embodiments, IC Fab 940 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 940 includes wafer fabrication tools 952 (hereinafter "fabrication tools 952") configured to execute various manufacturing operations on semiconductor wafer 942 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 940 uses mask(s) 945 fabricated by mask house 930 to fabricate IC device 960. Thus, IC fab 940 at least indirectly uses IC design layout 922 to fabricate IC device 960. In some embodiments, a semiconductor wafer 942 is fabricated by IC fab 940 using mask(s) 945 to form IC device 960. In some embodiments, the IC fabrication includes performing one or more lithographic exposures based at least indirectly on IC design layout 922. Semiconductor wafer 942 includes a silicon substrate or other proper substrate having material layers formed thereon. Semiconductor wafer 942 further includes one or more of various doped regions, dielectric features, multilevel interconnects, and the like (formed at subsequent manufacturing steps).

System 900 is shown as having design house 920, mask house 930 or IC fab 940 as separate components or entities. However, it is understood that one or more of design house 920, mask house 930 or IC fab 940 are part of the same component or entity.

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to a circuit. The circuit includes a circuit includes an input circuit, a level shifter circuit and an output circuit. In some embodiments, the input circuit is coupled to a first voltage supply, and configured to receive a first input signal, and to generate at least a second input signal or a third input signal. In some embodiments, the level shifter circuit is coupled to at least the input circuit and a second voltage supply different from the first voltage supply, and configured to receive at least a first enable signal, the second input signal or the third input signal, and to generate at least a first signal responsive to at least the first enable signal, the second input signal or the third input signal. In some embodiments, the level shifter circuit includes a header circuit coupled to a first node of the level shifter circuit. In some embodiments, the header circuit is configured to receive the first enable signal. In some embodiments, the header circuit is configured to enable or disable the level shifter circuit responsive to the first enable signal. In some embodiments, the output circuit is coupled to at least the level shifter circuit and the second voltage supply, and configured to receive the first signal, and to generate at least an output signal.

Another aspect of this description relates to a circuit. The circuit includes an input circuit, a level shifter circuit and an output circuit. In some embodiments, the input circuit is coupled to a first voltage supply, and configured to receive a first input signal having a first voltage swing, and to generate at least a second input signal or a third input signal. In some embodiments, the level shifter circuit is coupled to at least the input circuit and a second voltage supply different from the first voltage supply, and configured to generate at least a first signal responsive to at least a first enable signal, the second input signal or the third input signal, the first signal having a second voltage swing different from the first voltage swing. In some embodiments, the level shifter circuit includes a first circuit, and a footer circuit. In some embodiments, the first circuit is coupled between the second voltage supply and a first node of the level shifter circuit, and the first circuit having a first threshold voltage. In some embodiments, the footer circuit is coupled to the first node of the level shifter circuit, the footer circuit configured to enable or disable the level shifter circuit responsive to the first enable signal, the footer circuit having a second threshold voltage different from the first threshold voltage. In some embodiments, the output circuit is coupled to at least the level shifter circuit and the second voltage supply, and configured to generate at least an output signal responsive to the first signal.

Yet another aspect of this description relates to a method of operating a circuit. The method includes enabling a level shifter circuit responsive to a first enable signal. In some embodiments, enabling the level shifter circuit includes enabling a first circuit in at least a first path or a second path in the level shifter circuit responsive to at least the first enable signal thereby electrically coupling the first path or the second path to a first voltage supply or a first reference supply; and generating a first signal responsive to at least a first input signal, the first input signal having a first voltage swing, and the first signal having a second voltage swing different from the first voltage swing. In some embodiments, the method further includes disabling a second circuit responsive to the first enable signal, the second circuit being coupled to a first output node of the level shifter circuit. In some embodiments, the method further includes generating, by an output circuit, an output signal responsive to at least the first enable signal or the first signal.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
    an input circuit coupled to a first voltage supply, and configured to receive a first input signal, and to generate at least a second input signal or a third input signal;
    a level shifter circuit coupled to at least the input circuit and a second voltage supply different from the first voltage supply, and configured to receive at least a first enable signal, the second input signal or the third input signal, and to generate at least a first signal responsive to at least the first enable signal, the second input signal or the third input signal, the level shifter circuit comprising:
        a header circuit coupled to a first node of the level shifter circuit, the header circuit configured to receive the first enable signal, the header circuit configured to enable or disable the level shifter circuit responsive to the first enable signal;

an output circuit coupled to at least the level shifter circuit and the second voltage supply, and configured to receive the first signal, and to generate at least an output signal; and an enable circuit coupled to the second voltage supply and the level shifter circuit, and configured to generate at least the first enable signal responsive to receive a second enable signal, wherein the input circuit has a first threshold voltage;

the enable circuit has a second threshold voltage different from the first threshold voltage;

a first portion of the level shifter circuit has the second threshold voltage, and the first portion of the level shifter circuit includes the header circuit;

a second portion of the level shifter circuit has a third threshold voltage different from the first threshold voltage and the second threshold voltage.

2. The circuit of claim 1, wherein the enable circuit comprises:

a first inverter including an input terminal configured to receive the second enable signal, and an output terminal configured to output the first enable signal, the first enable signal being inverted from the second enable signal.

3. The circuit of claim 1, wherein the output circuit has the second threshold voltage.

4. The circuit of claim 1, wherein the level shifter circuit further comprises:

a first path coupled between the first node and a reference voltage supply node having a reference supply voltage; and a second path in parallel with the first path, the second path being coupled between the first node and the reference voltage supply node.

5. The circuit of claim 4, wherein the first path comprises:

a first p-type transistor having a first terminal configured to receive the first signal, and a second terminal of the first p-type transistor is coupled to the first node and the header circuit;

a second p-type transistor having a first terminal configured to receive the second input signal, a second terminal of the second p-type transistor is coupled to a third terminal of the first p-type transistor, and a third terminal of the second p-type transistor is coupled to at least a second node; and a first n-type transistor having a first terminal configured to receive the second input signal, a second terminal of the first n-type transistor is coupled to the second node and the third terminal of the second p-type transistor, and a third terminal of the first n-type transistor is coupled to the reference voltage supply node.

6. The circuit of claim 5, wherein the second path comprises:

a third p-type transistor having a first terminal configured to receive a second signal inverted from the first signal, and a second terminal of the third p-type transistor is coupled to the first node, the header circuit and the second terminal of the first p-type transistor;

a fourth p-type transistor having a first terminal configured to receive the third input signal, a second terminal of the fourth p-type transistor is coupled to a third terminal of the third p-type transistor, and a third terminal of the fourth p-type transistor is coupled to at least a third node; and a second n-type transistor having a first terminal configured to receive the third input signal, a second terminal of the second n-type transistor is coupled to the third node and the third terminal of the fourth p-type transistor, and a third terminal of the second n-type transistor is coupled to the reference voltage supply node.

7. The circuit of claim 1, wherein the header circuit comprises:

a first p-type transistor having a first terminal configured to receive the first enable signal, a second terminal of the first p-type transistor is coupled to the second voltage supply having a first supply voltage, and a third terminal of the first p-type transistor is coupled to the first node.

8. The circuit of claim 1, wherein the output circuit comprises:

a first p-type transistor having a first terminal configured to receive the first signal, and a second terminal of the first p-type transistor is coupled to the second voltage supply;

a second p-type transistor having a first terminal configured to receive the first signal, a second terminal of the second p-type transistor is coupled to a third terminal of the first p-type transistor, and a third terminal of the second p-type transistor is coupled to at least an output node; and a first n-type transistor having a first terminal configured to receive the first signal, a second terminal of the first n-type transistor is coupled to the output node and the third terminal of the second p-type transistor; and a second n-type transistor having a first terminal configured to receive the first signal, a second terminal of the second n-type transistor is coupled to a third terminal of the first n-type transistor, and a third terminal of the second n-type transistor is coupled to a reference voltage supply node.

9. The circuit of claim 8, wherein the output circuit further comprises:

a third n-type transistor having a first terminal configured to receive the first enable signal, a second terminal of the third n-type transistor is coupled to each of the first terminal of the first p-type transistor, the first terminal of the second p-type transistor, the first terminal of the first n-type transistor and the first terminal of the second n-type transistor, and a third terminal of the third n-type transistor is coupled to the reference voltage supply node.

10. A circuit comprising:

an input circuit coupled to a first voltage supply, and configured to receive a first input signal having a first voltage swing, and to generate at least a second input signal or a third input signal;

a level shifter circuit coupled to at least the input circuit and a second voltage supply different from the first voltage supply, and configured to generate at least a first signal responsive to at least a first enable signal, the second input signal or the third input signal, the first signal having a second voltage swing different from the first voltage swing, the level shifter circuit comprising:

a first circuit coupled between the second voltage supply and a first node of the level shifter circuit, and the first circuit having a first threshold voltage; and a footer circuit coupled to the first node of the level shifter circuit, the footer circuit configured to enable or disable the level shifter circuit responsive to the first enable signal, the footer circuit having a second threshold voltage different from the first threshold voltage;

an output circuit coupled to at least the level shifter circuit and the second voltage supply, and configured to generate at least an output signal responsive to the first signal; and an enable circuit coupled to the second voltage supply and the level shifter circuit, and configured to generate at least the first enable signal responsive to a second enable signal and a third enable signal, wherein the input circuit has a third threshold voltage different from the first threshold voltage and the second threshold voltage; and the enable circuit has the first threshold voltage.

11. The circuit of claim 10, wherein the footer circuit comprises:

a first n-type transistor having a first terminal configured to receive the first enable signal, a second terminal of the first n-type transistor is coupled to the first node, and a third terminal of the first n-type transistor is coupled to a reference voltage supply node.

12. The circuit of claim 10, wherein the enable circuit comprises:

a first inverter including a first input terminal configured to receive the second enable signal, and a first output terminal configured to output the third enable signal, the third enable signal being inverted from the second enable signal; and a second inverter including a second input terminal coupled to the first output terminal, and being configured to receive the third enable signal, and a second output terminal configured to output the first enable signal, the first enable signal being inverted from the third enable signal.

13. The circuit of claim 10, wherein the output circuit comprises:

a first p-type transistor having a first terminal configured to receive the first signal, and a second terminal of the first p-type transistor is coupled to the second voltage supply;

a second p-type transistor having a first terminal configured to receive the first signal, a second terminal of the second p-type transistor is coupled to a third terminal of the first p-type transistor, and a third terminal of the second p-type transistor is coupled to at least a first output node; and a first n-type transistor having a first terminal configured to receive the first signal, a second terminal of the first n-type transistor is coupled to the first output node and the third terminal of the second p-type transistor; and a second n-type transistor having a first terminal configured to receive the first signal, a second terminal of the second n-type transistor is coupled to a third terminal of the first n-type transistor, and a third terminal of the second n-type transistor is coupled to a reference voltage supply node, wherein the third terminal of the second p-type transistor and the second terminal of the first n-type transistor are configured to output a first output signal on the first output node.

14. The circuit of claim 13, wherein the output circuit further comprises:

a third p-type transistor having a first terminal configured to receive the first output signal, and a second terminal of the third p-type transistor is coupled to the second voltage supply;

a fourth p-type transistor having a first terminal configured to receive the first output signal, a second terminal of the fourth p-type transistor is coupled to a third terminal of the third p-type transistor, and a third terminal of the fourth p-type transistor is coupled to at least a second output node; and a third n-type transistor having a first terminal configured to receive the first output signal, a second terminal of the third n-type transistor is coupled to the second output node and the third terminal of the fourth p-type transistor; and a fourth n-type transistor having a first terminal configured to receive the first output signal, a second terminal of the fourth n-type transistor is coupled to a third terminal of the third n-type transistor, and a third terminal of the fourth n-type transistor is coupled to the reference voltage supply node;

wherein each of the first terminal of the third p-type transistor, the first terminal of the fourth p-type transistor, the first terminal of the third n-type transistor and the first terminal of the fourth n-type transistor are coupled to the first output node, the third terminal of the second p-type transistor and the second terminal of the first n-type transistor, and the third terminal of the fourth p-type transistor and the second terminal of the third n-type transistor are configured to output the output signal on the second output node.

15. The circuit of claim 14, wherein the output circuit further comprises:

a fifth p-type transistor having a first terminal configured to receive the first enable signal, a second terminal of the fifth p-type transistor is coupled to each of the first terminal of the first p-type transistor, the first terminal of the second p-type transistor, the first terminal of the first n-type transistor and the first terminal of the second n-type transistor, and a third terminal of the fifth p-type transistor is coupled to the second voltage supply.

16. The circuit of claim 10, wherein the input circuit comprises:

a first inverter including a first input terminal configured to receive the first input signal, and a first output terminal configured to output the second input signal, the second input signal being inverted from the first input signal; and a second inverter including a second input terminal coupled to the first output terminal, and being configured to receive the second input signal, and a second output terminal configured to output the third input signal, the third input signal being inverted from the second input signal.

17. A method of operating a circuit, the method comprising:

enabling a level shifter circuit responsive to a first enable signal, the first enable signal being generated by an enable circuit having a first threshold voltage, wherein enabling the level shifter circuit comprises:

enabling a first circuit in at least a first path or a second path in the level shifter circuit responsive to at least the first enable signal thereby electrically coupling the first path or the second path to a first voltage supply, the first circuit having a second threshold voltage different from the first threshold voltage; and generating a first signal responsive to at least a first input signal, the first input signal having a first voltage swing, and the first signal having a second voltage swing different from the first voltage swing, the first input signal being generated by an input circuit, the input circuit having a third threshold voltage different from the first threshold voltage and the second threshold voltage;

disabling a second circuit responsive to the first enable signal, the second circuit being coupled to a first output node of the level shifter circuit; and generating, by an output circuit, an output signal responsive to at least the first enable signal or the first signal.

18. The method of claim 17, further comprising:

disabling the level shifter circuit responsive to the first enable signal, wherein disabling the level shifter circuit comprises:

disabling the first circuit in at least the first path or the second path in the level shifter circuit responsive to at least the first enable signal thereby electrically decoupling the first path or the second path from the first voltage supply or a reference supply;

enabling the second circuit responsive to the first enable signal; and setting the first signal responsive to enabling the second circuit.

19. The circuit of claim 1, wherein the input circuit comprises:

a first inverter including a first input terminal configured to receive the first input signal, and a first output terminal configured to output the second input signal, the second input signal being inverted from the first input signal; and a second inverter including a second input terminal coupled to the first output terminal, and being configured to receive the second input signal, and a second output terminal configured to output the third input signal, the third input signal being inverted from the second input signal.

20. The circuit of claim 10, wherein the output circuit has the first threshold voltage.

* * * * *